United States Patent
Itou et al.

(10) Patent No.: US 10,826,460 B2
(45) Date of Patent: Nov. 3, 2020

(54) MULTIPLEXER

(71) Applicant: TAIYO YUDEN CO., LTD., Tokyo (JP)

(72) Inventors: Daiki Itou, Tokyo (JP); Yasuhisa Okamoto, Tokyo (JP); Takuma Kuroyanagi, Tokyo (JP); Fumiaki Isaka, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 21 days.

(21) Appl. No.: 16/235,533

(22) Filed: Dec. 28, 2018

(65) Prior Publication Data

US 2019/0260351 A1    Aug. 22, 2019

(30) Foreign Application Priority Data

Feb. 21, 2018    (JP) ................. 2018-028685

(51) Int. Cl.
*H03H 9/05* (2006.01)
*H03H 9/64* (2006.01)
(Continued)

(52) U.S. Cl.
CPC .......... *H03H 9/0566* (2013.01); *H03H 9/058* (2013.01); *H03H 9/0547* (2013.01);
(Continued)

(58) Field of Classification Search
CPC .... H03H 9/0566; H03H 9/725; H03H 9/0547; H03H 9/6483; H03H 9/706; H03H 9/605;
(Continued)

(56) References Cited

U.S. PATENT DOCUMENTS

| 7,378,922 B2 * | 5/2008 | Kubo ................. B81C 1/00238 |
| | | 333/133 |
| 2009/0224851 A1 | 9/2009 | Feiertag et al. .............. 333/186 |

(Continued)

FOREIGN PATENT DOCUMENTS

| JP | 2002-043890 A | 2/2002 |
| JP | 2007-67617 A | 3/2007 |

(Continued)

*Primary Examiner* — Robert J Pascal
*Assistant Examiner* — Jorge L Salazar, Jr.
(74) *Attorney, Agent, or Firm* — Stein IP, LLC

(57) ABSTRACT

A multiplexer includes: a filter located on a surface of a substrate and including first series and parallel resonators and a first wiring line; and another filter located on another surface of another substrate and including second series and parallel resonators and a second wiring line, each of first resonators among the second series and parallel resonators overlapping with the first series and parallel resonators, and/or the first wiring line, each of second resonators other than the first resonators among the second series and parallel resonators overlapping with none of the first series and parallel resonators and the first wiring line, when capacitances of series and parallel resonators in first basic sections including the first resonators are represented by Cs1 and Cp1, and capacitances of series and parallel resonators in second basic sections not including the first resonators are represented by Cs2 and Cp1, Cp1/Cs1 being less than Cp2/Cs2.

10 Claims, 22 Drawing Sheets

(51) Int. Cl.
*H03H 9/10* (2006.01)
*H03H 9/72* (2006.01)
*H03H 9/70* (2006.01)
*H03H 9/60* (2006.01)

(52) U.S. Cl.
CPC .......... *H03H 9/1064* (2013.01); *H03H 9/605* (2013.01); *H03H 9/64* (2013.01); *H03H 9/6483* (2013.01); *H03H 9/706* (2013.01); *H03H 9/725* (2013.01)

(58) Field of Classification Search
CPC ........ H03H 9/1064; H03H 9/058; H03H 9/64; H03H 9/6426; H03H 9/6469
USPC .......................... 333/133, 187, 188, 193–196
See application file for complete search history.

(56) References Cited

U.S. PATENT DOCUMENTS

2010/0091473 A1  4/2010  Kiwitt et al. ................. 361/782
2017/0294895 A1  10/2017  Kakita et al.
2017/0331455 A1  11/2017  Kuroyanagi

FOREIGN PATENT DOCUMENTS

| JP | 2008-546207 A | 12/2008 |
| JP | 2010-526456 A | 7/2010 |
| JP | 2017-188807 A | 10/2017 |
| JP | 2017-204827 A | 11/2017 |

\* cited by examiner

FIG. 6

| | BASIC SECTIONS 61, 62, AND 63 OF PART 54 | | | |
|---|---|---|---|---|
| | Cs [pF] | Cp [pF] | Cp/Cs | Cp×Cs [pF²] |
| SAMPLE A | $\frac{1}{\sqrt{1.3}}$ | $\sqrt{1.3}$ | 1.30 | 1.00 |
| SAMPLE B | $\frac{1}{\sqrt{1.1}}$ | $\sqrt{1.1}$ | 1.10 | 1.00 |
| SAMPLE C | 1.00 | 1.00 | 1.00 | 1.00 |
| SAMPLE D | $\frac{1}{\sqrt{0.9}}$ | $\sqrt{0.9}$ | 0.9 | 1.00 |
| SAMPLE E | $\frac{1}{\sqrt{0.7}}$ | $\sqrt{0.7}$ | 0.7 | 1.00 |

| | BASIC SECTIONS 64, 65, AND 66 OF PART 56 | | | |
|---|---|---|---|---|
| | Cs [pF] | Cp [pF] | Cp/Cs | Cp×Cs [pF²] |
| SAMPLE A | $\sqrt{1.3}$ | $\frac{1}{\sqrt{1.3}}$ | $\frac{1}{1.3}$ | 1.00 |
| SAMPLE B | $\sqrt{1.1}$ | $\frac{1}{\sqrt{1.1}}$ | $\frac{1}{1.1}$ | 1.00 |
| SAMPLE C | 1.00 | 1.00 | 1.00 | 1.00 |
| SAMPLE D | $\sqrt{0.9}$ | $\frac{1}{\sqrt{0.9}}$ | $\frac{1}{0.9}$ | 1.00 |
| SAMPLE E | $\sqrt{0.7}$ | $\frac{1}{\sqrt{0.7}}$ | $\frac{1}{0.7}$ | 1.00 |

| | GEOMETRIC MEAN OF BASIC SECTIONS 61 THROUGH 66 | |
|---|---|---|
| | Cp/Cs | Cp×Cs [pF²] |
| SAMPLE A | 1.00 | 1.00 |
| SAMPLE B | 1.00 | 1.00 |
| SAMPLE C | 1.00 | 1.00 |
| SAMPLE D | 1.00 | 1.00 |
| SAMPLE E | 1.00 | 1.00 |

MULTIPLEXER

CROSS-REFERENCE TO RELATED APPLICATION

This application is based upon and claims the benefit of priority of the prior Japanese Patent Application No. 2018-028685, filed on Feb. 21, 2018, the entire contents of which are incorporated herein by reference.

FIELD

A certain aspect of the present invention relates to a multiplexer.

BACKGROUND

It has been known to mount two substrates having filters formed thereon so that the surfaces having the filters formed thereon face each other across an air gap, as disclosed in, for example, Japanese Patent Application Publication No. 2007-67617 (hereinafter, referred to as Patent Document 1). Patent Document 1 describes that the two filters are arranged so as to overlap in plan view and that two filters are arranged so as not to overlap in plan view.

SUMMARY OF THE INVENTION

According to an aspect of the present invention, there is provided a multiplexer including: a first substrate having a first surface; a second substrate having a second surface, the second surface facing the first surface across an air gap; a first filter located on the first surface and including one or more first series resonators and one or more first parallel resonators, the one or more first series resonators being connected in series through at least a part of a first wiring line between a common terminal and a first terminal, the one or more first parallel resonators being connected in parallel through at least a part of the first wiring line between the common terminal and the first terminal; and a second filter located on the second surface and including one or more second series resonators and one or more second parallel resonators, the one or more second series resonators being connected in series through at least a part of a second wiring line between the common terminal and a second terminal, the one or more second parallel resonators being connected in parallel through at least a part of the second wiring line between the common terminal and the second terminal, in each of one or more first resonators among the one or more second series resonators and the one or more second parallel resonators, at least a part of a corresponding first resonator of the one or more first resonators and/or at least a part of a second wiring line adjacent to the corresponding first resonator overlapping with at least a part of the one or more first series resonators, at least a part of the one or more first parallel resonators, and/or at least a part of the first wiring line in plan view, in each of one or more second resonators other than the one or more first resonators among the one or more second series resonators and the one or more second parallel resonators, a corresponding second resonator of the one or more second resonators and a second wiring line adjacent to the corresponding second resonator overlapping with none of the one or more first series resonators, the one or more first parallel resonators, and the first wiring line in plan view, when the one or more second series resonators and the one or more second parallel resonators are expressed by an equivalent circuit composed of basic sections mirror-symmetrically connected, electrostatic capacitance values of a series resonator and a parallel resonator in one or more first basic sections including the one or more first resonators are respectively represented by $Cs1$ and $Cp1$, and electrostatic capacitance values of a series resonator and a parallel resonator in one or more second basic sections including the one or more second resonators and not including the one or more first resonators are respectively represented by $Cs2$ and $Cp2$, at least one of ratios $Cp1/Cs1$ being less than at least one of ratios $Cp2/Cs2$.

BRIEF DESCRIPTION OF THE DRAWINGS

FIG. 6 presents electrostatic capacitances of samples A through E in the simulation;

DETAILED DESCRIPTION

When two filters are arranged so as to overlap, the filters interfere with each other, and the isolation characteristic thereby deteriorates. When two filters are arranged so as not to overlap, the size reduction is difficult.

Hereinafter, a description will be given of embodiments of the present disclosure with reference to the accompanying drawings.

First Embodiment

Figure 1:
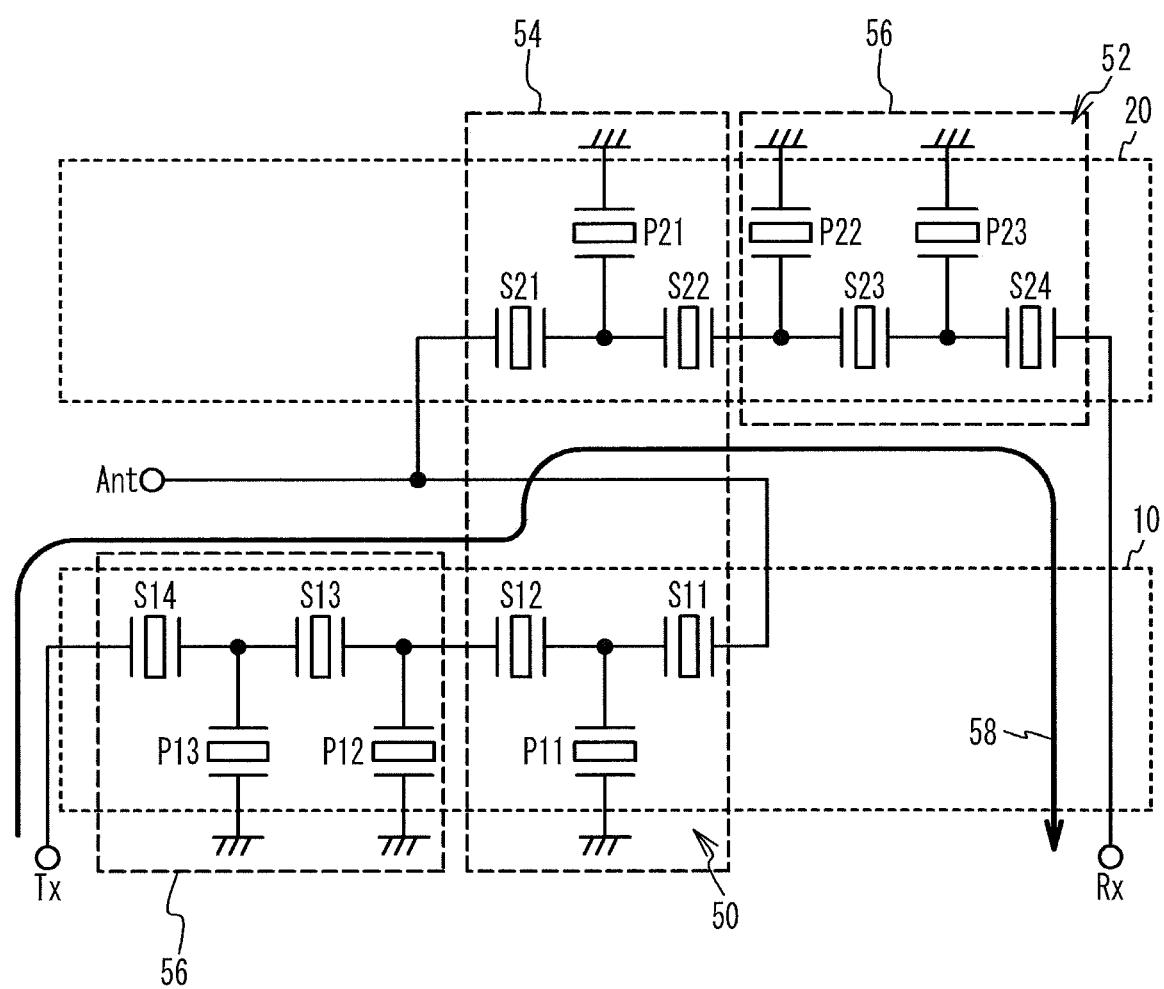
FIG. 1 is a circuit diagram of a multiplexer in accordance with a first embodiment.

FIG. 1 is a circuit diagram of a multiplexer in accordance with a first embodiment. As illustrated in FIG. 1, a transmit filter 50 is connected between a common terminal Ant and a transmit terminal Tx. A receive filter 52 is connected between the common terminal Ant and a receive terminal Rx. The passband of the transmit filter 50 and the passband of the receive filter 52 do not overlap with each other. The transmit filter 50 outputs signals in the transmit band to the common terminal Ant among high-frequency signals input to the transmit terminal Tx, and suppresses signals with other frequencies. The receive filter 52 outputs signals in the receive band to the receive terminal Rx among high-frequency signals input to the common terminal Ant, and suppresses signals with other frequencies.

The transmit filter 50 is a ladder-type filter, and includes series resonators S11 through S14 and parallel resonators P11 through P13. The series resonators S11 through S14 are connected in series between the common terminal Ant and the transmit terminal Tx. The parallel resonators P11 through P13 are connected in parallel between the common terminal Ant and the transmit terminal Tx. The receive filter 52 is a ladder-type filter, and includes series resonators S21 through S24 and parallel resonators P21 through P23. The series resonators S21 through S24 are connected in series between the common terminal Ant and the receive terminal Rx. The parallel resonators P21 through P23 are connected in parallel between the common terminal Ant and the receive terminal Rx.

Figure 2:
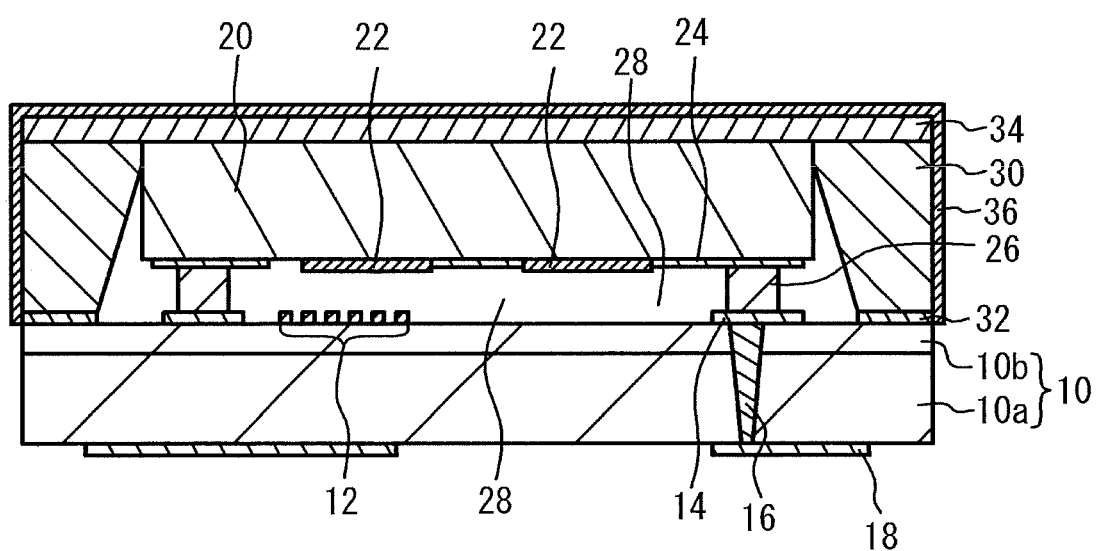
FIG. 2 is a cross-sectional view of the multiplexer in accordance with the first embodiment.

FIG. 2 is a cross-sectional view of the multiplexer in accordance with the first embodiment. As illustrated in FIG. 2, a substrate 20 is mounted on a substrate 10. The substrate 10 has a support substrate 10a and a piezoelectric substrate 10b. The support substrate 10a is, for example, a sapphire substrate, a spinel substrate, an alumina substrate, a crystal substrate, or a silicon substrate. The piezoelectric substrate 10b is, for example, a lithium tantalate substrate or a lithium niobate substrate. The piezoelectric substrate 10b is bonded on the upper surface of the support substrate 10a. The bonded surface between the piezoelectric substrate 10b and the support substrate 10a has a planar surface, and is flat. The substrate 10 is a piezoelectric substrate, and may not be necessarily bonded on the support substrate.

An acoustic wave resonator 12 and wiring lines 14 are located on the upper surface of the substrate 10. Terminals 18 are located on the lower surface of the substrate 10. The terminals 18 are foot pads for connecting the acoustic wave resonators 12 and 22 to an external device. A via wiring line 16 penetrating through the substrate 10 is provided. The via wiring line 16 electrically connects the wiring line 14 and the terminal 18. The wiring lines 14, the via wiring line 16, and the terminals 18 are formed of a metal layer such as, for example, a copper layer, an aluminum layer, or a gold layer.

The terminals 18 include the common terminal Ant, the transmit terminal Tx, the receive terminal Rx, and a ground terminal.

The acoustic wave resonators 22 and wiring lines 24 are located on the lower surface of the substrate 20. The substrate 20 is, for example, a sapphire substrate, a spinel substrate, an alumina substrate, a glass substrate, a crystal substrate, or a silicon substrate. The wiring line 24 is formed of a metal layer such as, for example, a copper layer, an aluminum layer, or a gold layer. The wiring line 14 of the substrate 10 and the wiring line 24 of the substrate 20 are bonded together through a bump 26. The upper surface of the substrate 10 and the lower surface of the substrate 20 face each other across an air gap 28.

A circular electrode 32 is located in the periphery of the upper surface of the substrate 10. A sealing portion 30 is located on the substrate 10 so as to surround the substrate 20. The sealing portion 30 is bonded on the circular electrode 32. The sealing portion 30 is made of a metal such as solder or an insulating material such as resin. A lid 34 is located on the upper surfaces of the substrate 20 and the sealing portion 30. The lid 34 is, for example, a metal plate made of kovar or an insulator plate. A protective film 36 is provided so as to cover the sealing portion 30 and the lid 34. The protective film 36 is, for example, a metal film made of nickel or an insulating film.

Figure 3A:
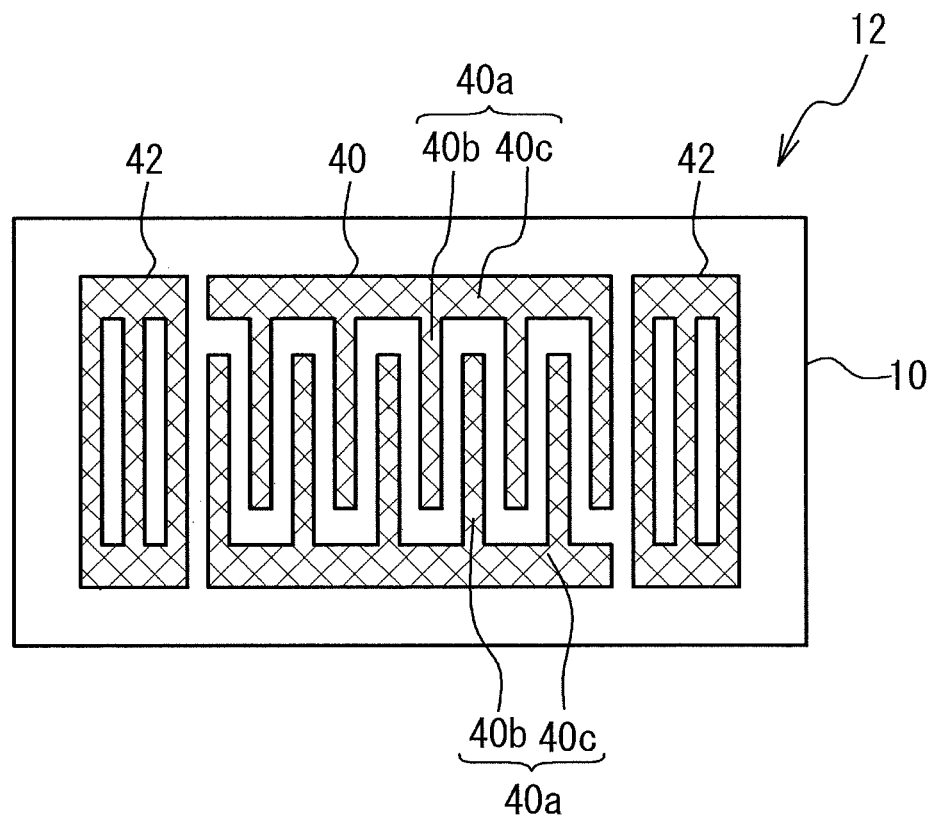
FIG. 3A is a plan view of an acoustic wave resonator 12 in the first embodiment.
Figure 3B:
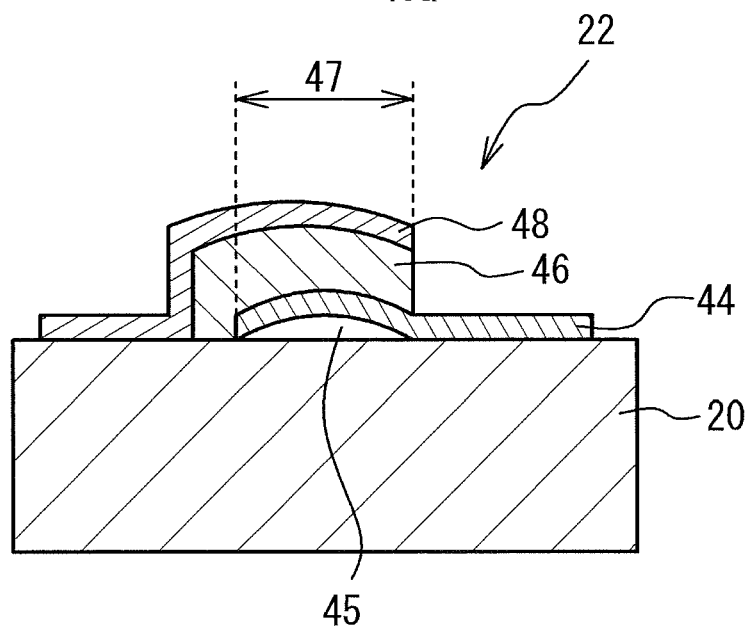
FIG. 3B is a cross-sectional view of an acoustic wave resonator 22 in the first embodiment.

FIG. 3A is a plan view of the acoustic wave resonator 12 in the first embodiment, and FIG. 3B is a cross-sectional view of the acoustic wave resonator 22 in the first embodiment. As illustrated in FIG. 3A, the acoustic wave resonator 12 is a surface acoustic wave resonator. An Interdigital Transducer (IDT) 40 and reflectors 42 are formed on the piezoelectric substrate 10b of the substrate 10. The IDT 40 includes a pair of comb-shaped electrodes 40a facing each other. The comb-shaped electrode 40a includes a plurality of electrode fingers 40b and a bus bar 40c connecting the electrode fingers 40b. The reflectors 42 are located at both sides of the IDT 40. The IDT 40 excites a surface acoustic wave on the substrate 10. The IDT 40 and the reflectors 42 are formed of, for example, an aluminum film or a copper film. A protective film or a temperature compensation film may be formed on the substrate 10 so as to cover the IDT 40 and the reflectors 42.

The electrostatic capacitance value of the surface acoustic wave resonator is the electrostatic capacitance value between a pair of the comb-shaped electrodes 40a, and is substantially proportional to the product of the aperture length along which the electrode fingers 40b of a pair of the comb-shaped electrodes 40a overlap with each other and the number of pairs of the electrode fingers 40b.

As illustrated in FIG. 3B, the acoustic wave resonator 22 is a piezoelectric thin film resonator. A piezoelectric film 46 is located on the substrate 20. A lower electrode 44 and an upper electrode 48 are located so as to sandwich the piezoelectric film 46. An air gap 45 is formed between the lower electrode 44 and the substrate 20. The region where the lower electrode 44 and the upper electrode 48 face each other across at least a part of the piezoelectric film 46 is a resonance region 47. The lower electrode 44 and the upper electrode 48 in the resonance region 47 excite the acoustic wave in the thickness extension mode in the piezoelectric film 46. The lower electrode 44 and the upper electrode 48 are formed of a metal film such as, for example, a ruthenium film. The piezoelectric film 46 is, for example, an aluminum nitride film.

The electrostatic capacitance value of the piezoelectric thin film resonator is the electrostatic capacitance value between the lower electrode 44 and the upper electrode 48, and is substantially proportional to the value obtained by dividing the area of the resonance region 47 by the film thickness of the piezoelectric film 46.

The acoustic wave resonators 12 and 22 include electrodes exciting the acoustic wave. Thus, the acoustic wave resonators 12 and 22 are covered with the air gap 28 so as not to prevent the excitation of the acoustic wave.

The transmit filter 50 in FIG. 1 is located on the upper surface of the substrate 10. The series resonators S11 through S14 and the parallel resonators P11 through P13 are the acoustic wave resonators 12. The receive filter 52 is located on the lower surface of the substrate 20. The series resonators S21 through S24 and the parallel resonators P21 through P23 are the acoustic wave resonators 22. The series resonators S11 and S12 and the parallel resonator P11, which are included in a part 54, of the transmit filter 50 overlap with the series resonators S21 and S22 and the parallel resonator P21, which are included in the part 54, of the receive filter 52 in plan view. The series resonators S13 and S14 and the parallel resonators P12 and P13, which are included in a part 56, of the transmit filter 50 overlap with none of the acoustic wave resonators 22 of the receive filter 52. The series resonators S23 and S24 and the parallel resonators P22 and P23, which are included in the part 56, of the receive filter 52 overlap with none of the acoustic wave resonators 12 of the transmit filter 50.

Signals in the receive band input from the transmit terminal Tx are suppressed by the transmit filter 50. When the transmit filter 50 and the receive filter 52 overlap with each other in the part 54, signals leak from the transmit filter 50 to the receive filter 52 through the air gap 28. Accordingly, as indicated by an arrow 58 in FIG. 1, signals in the receive band leak from the transmit terminal Tx to the receive terminal Rx. Thus, the isolation characteristic deteriorates. The isolation characteristic is improved by arranging the transmit filter 50 and the receive filter 52 so that the transmit filter 50 and the receive filter 52 do not overlap with each other in plan view. However, this structure increases the size of the multiplexer. The size of the multiplexer can be reduced by arranging the transmit filter 50 and the receive filter 52 so that the transmit filter 50 and the receive filter 52 overlap with each other in plan view. However, this structure deteriorates the isolation characteristic. Thus, the transmit filter 50 and the receive filter 52 are arranged so that a part of the transmit filter 50 overlaps with a part of the receive filter 52 in plan view. This structure reduces deterioration in the isolation characteristic and reduces the size.

Simulation

Simulated was a preferred relationship between the electrostatic capacitances of the series resonator and the parallel resonator when a part of the transmit filter 50 overlaps with a part of the receive filter 52 in plan view. In the simulation, the acoustic wave resonators 12 and 22 assumed for Long Term Evolution (LTE) Band7 (transmit band: 2500 MHz to 2570 MHz, receive band: 2620 MHz to 2690 MHz) were used.

Figure 4:
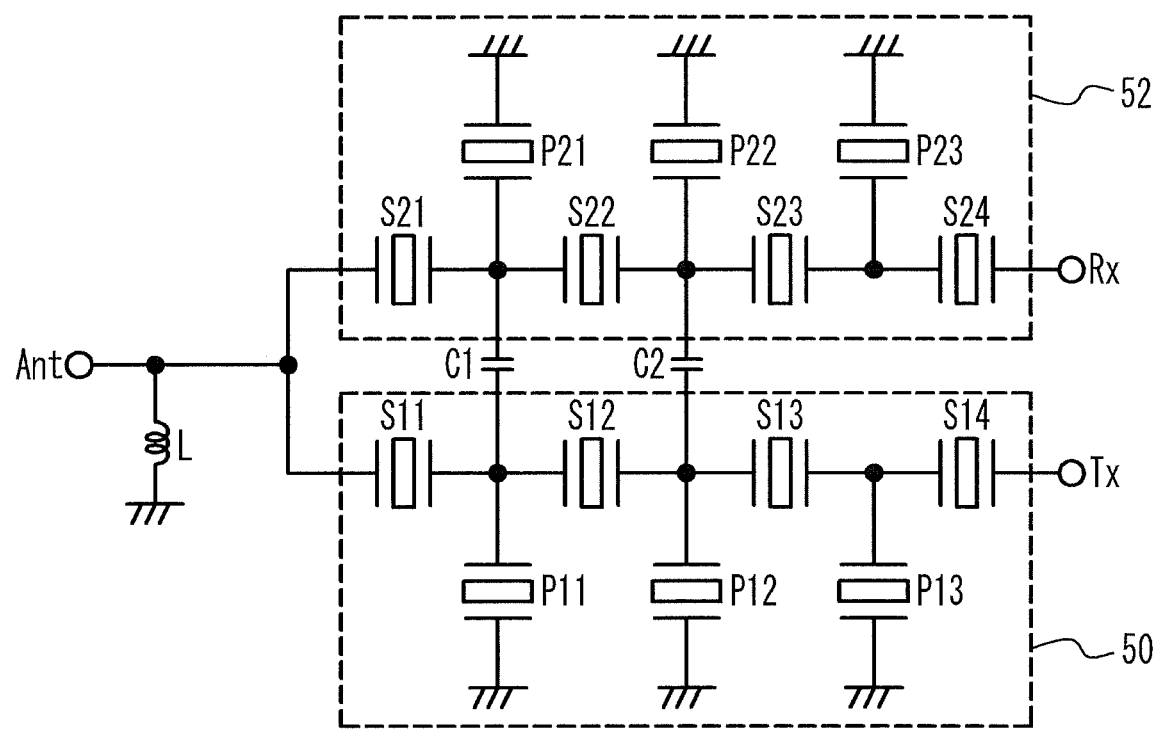
FIG. 4 illustrates an equivalent circuit in a simulation.

FIG. 4 illustrates an equivalent circuit in the simulation. As illustrated in FIG. 4, an inductor L is electrically connected between the common terminal Ant and a ground. The inductor L is a matching circuit. To equivalently express the structure in which the transmit filter 50 and the receive filter 52 overlap with each other in plan view, it was determined that capacitors C1 and C2 were electrically connected between the transmit filter 50 and the receive filter 52. The capacitor C1 is electrically connected between a node between the series resonators S11 and S12 and a node between the series resonators S21 and S22. The capacitor C2 is electrically connected between a node between the series resonators S12 and S13 and a node between the series resonators S22 and S23. Each of the capacitors C1 and C2 was assumed to have an electrostatic capacitance value of 0.1 pF.

Figure 5:
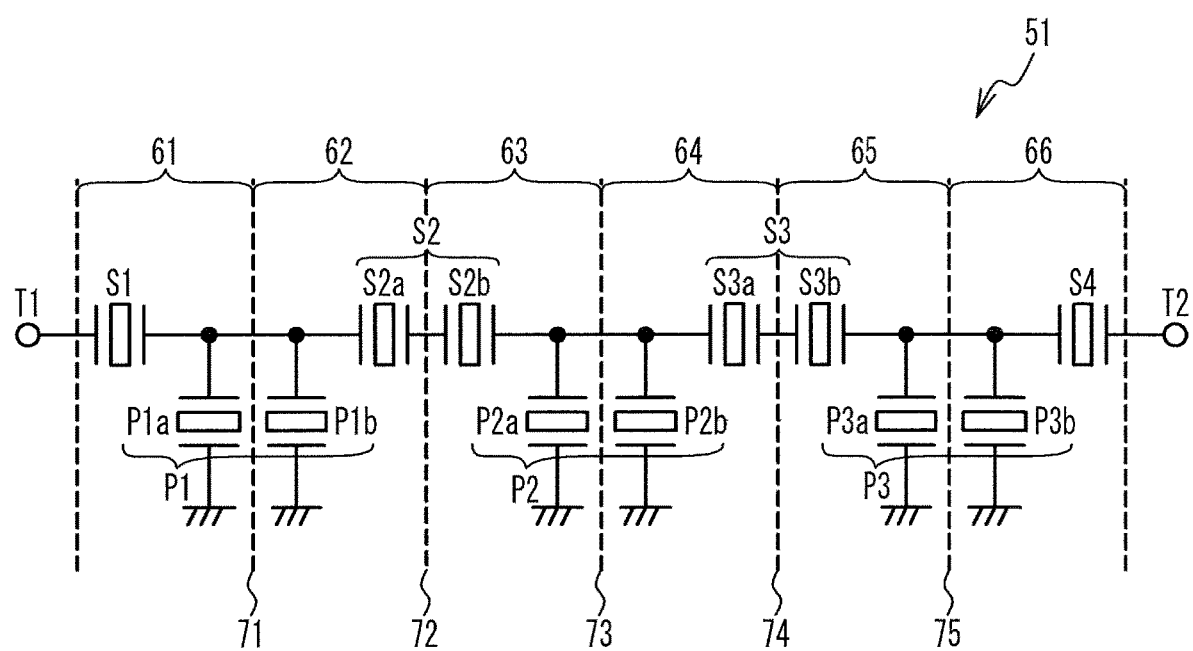
FIG. 5 is a circuit diagram illustrating an equivalent circuit of a filter in the simulation.

The transmit filter 50 and the receive filter 52 were divided into basic sections, and the electrostatic capacitance ratio between the series resonator and the parallel resonator was varied. FIG. 5 is a circuit diagram illustrating an equivalent circuit of a filter in the simulation. As illustrated in FIG. 5, a filter 51 is connected between terminals T1 and T2. The filter 51 corresponds to each of the transmit filter 50 and the receive filter 52.

The filter 51 is divided into six sections, which are basic sections 61 through 66. The basic sections 61 and 62 are mirror-symmetrically connected with respect to a line 71. The basic sections 62 and 63 are mirror-symmetrically connected with respect to a line 72. In the same manner, the basic sections 63 and 64 are mirror-symmetrically connected with respect to a line 73, the basic sections 64 and 65 are mirror-symmetrically connected with respect to a line 74, and the basic sections 65 and 66 are mirror-symmetrically connected with respect to a line 75. When the filter 51 is divided into the above basic sections, the series resonator S2 is divided in series into series resonators S2a and S2b. The series resonator S3 is divided in series into series resonators S3a and S3b. The parallel resonator P1 is divided in parallel into resonators P1a and P1b. The parallel resonator P2 is divided in parallel into parallel resonators P2a and P2b. The parallel resonator P3 is divided in parallel into parallel resonators P3a and P3b. In the example of FIG. 1, the basic section corresponding to the part 54 (that is, the basic section where the transmit filter 50 and the receive filter 52 overlap with each other) is the basic sections 61 through 63. The basic section corresponding to the part 56 (that is, the basic section where the transmit filter 50 and the receive filter 52 do not overlap) is the basic sections 64 through 66. In FIG. 1, the parallel resonators P12 and P22 are included in the part 56, but the series resonators S12 and S22 are included in the part 54. Thus, the basic section 63 was determined to be included in the part 54.

When a series resonator S with an electrostatic capacitance value of Cs is divided in series into a resonator Sa with an electrostatic capacitance value of Csa and a resonator Sb with an electrostatic capacitance value of Csb, Cs=(Csa× Csb)/(Csa+Csb). When a parallel resonator P with an electrostatic capacitance value of Cp is divided in parallel into a resonator Pa with an electrostatic capacitance value of Cpa and a resonator Pb with an electrostatic capacitance value of Cpb, Cp=Cpa+Cpb.

FIG. 6 illustrates the electrostatic capacitances of samples A through E in the simulation. The electrostatic capacitance values of the series resonator and the parallel resonator in each of the basic sections 61 through 66 were represented by Cs and Cp, respectively. The samples A through C correspond to comparative examples, and the samples D and E indicated by hatching correspond to the embodiment. As illustrated in FIG. 6, in the sample C, each of Cs and Cp in each of the basic sections 61 through 66 is 1 pF. The ratio Cp/Cs is 1, and Cp×Cs is 1 pF$^2$. The geometric mean of the ratios Cp/Cs of the basic sections 61 through 66 is 1, and Cp×Cs is 1 pF$^2$. The geometric mean of the ratios Cp/Cs is obtained by multiplying the ratios Cp/Cs of the basic sections 61 through 66 and then obtaining the sixth root of the product.

In the sample A, in each of the basic sections 61 through 63 of the part 54, Cs is $1/\sqrt{1.3}$ pF, Cp is $\sqrt{1.3}$ pF, Cp/Cs is 1.3, and Cp×Cs is 1 pF². In each of the basic sections 64 through 66 of the part 56, Cs is VU pF, Cp is $\sqrt{1.3}$ pF, Cp/Cs is $1/\sqrt{1.3}$, and Cp×Cs is 1 pF². The geometric mean of the ratios Cp/Cs of the basic sections 61 through 66 is 1, and the geometric mean of the products Cp×Cs of the basic sections 61 through 66 is 1 pF². In the sample B, in each of the basic sections 61 through 63, Cs is $1/\sqrt{1.1}$ pF, Cp is $\sqrt{1.1}$ pF, and Cp/Cs is 1.1. In each of the basic sections 64 through 66, Cs is $\sqrt{1.1}$ pF, Cp is $1/\sqrt{1.1}$ pF, and Cp/Cs is 1/1.1.

In the sample D, in each of the basic sections 61 through 63, Cs is $1/\sqrt{0.9}$ pF, Cp is $\sqrt{0.9}$ pF, and Cp/Cs is 0.9. In each of the basic sections 64 through 66, Cs is $\sqrt{0.9}$ pF, Cp is $1/\sqrt{0.9}$ pF, and Cp/Cs is $1/\sqrt{0.9}$. In the sample E, in each of the basic sections 61 through 63, Cs is $1/\sqrt{0.7}$ pF, Cp is $\sqrt{0.7}$ pF, and Cp/Cs is 0.7. In each of the basic sections 64 through 66, Cs is $\sqrt{0.7}$ pF, Cp is $1/\sqrt{0.7}$ pF, and Cp/Cs is 1/0.7.

Figure 7:
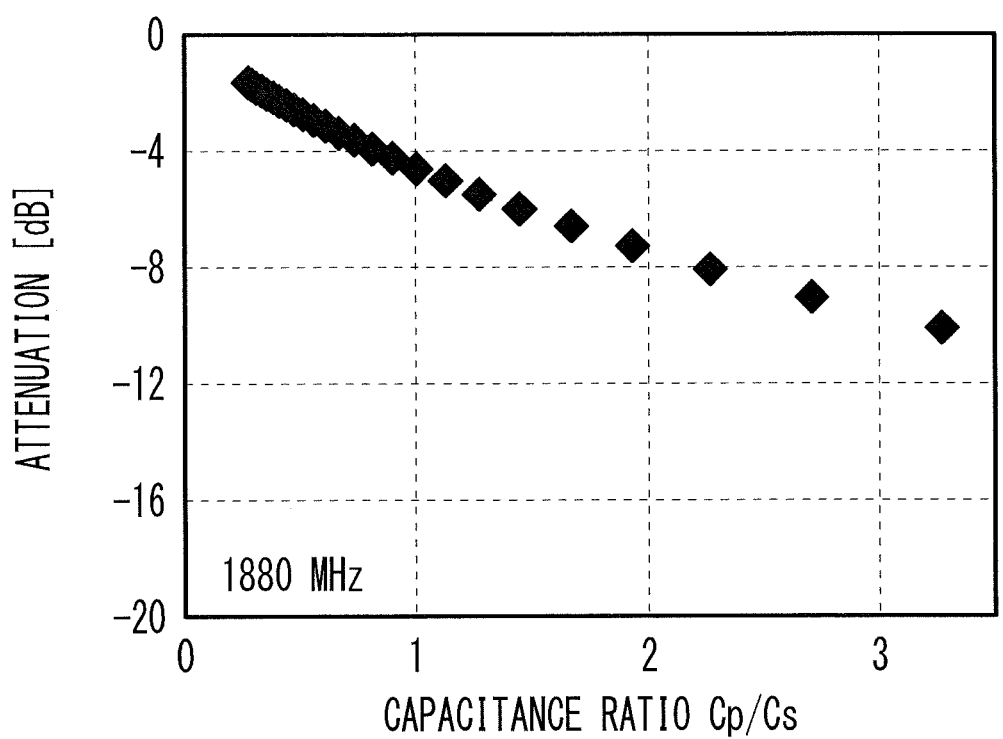
FIG. 7 is a graph of attenuation versus a capacitance ratio $Cp/Cs$ in one basic section in the simulation.

The reason why the geometric mean of the ratios Cp/Cs in the basic sections 61 through 66 is made to be the same among the samples A through E will be described. FIG. 7 is a graph of attenuation versus a capacitance ratio Cp/Cs in one basic section in the simulation. As illustrated in FIG. 7, as Cp/Cs increases, the attenuation at 1880 MHz increases. As seen above, the filter characteristics depend on Cp/Cs. Thus, not to change the filter characteristics, the geometric mean of the ratios Cp/Cs of the basic sections 61 through 66 was made to be the same, which is 1 pF², among the samples A through E.

Figure 8A:
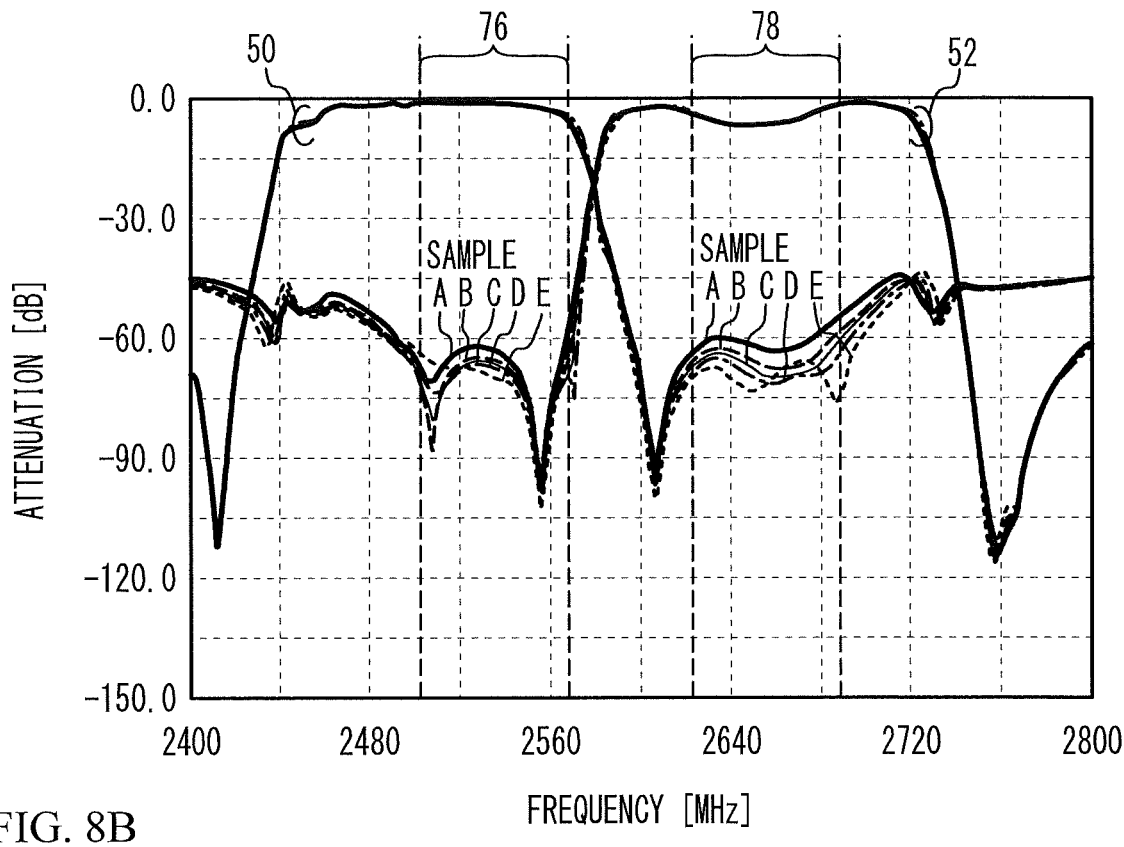
FIG. 8A and FIG. 8B respectively illustrate transmission characteristics and isolation characteristics in the simulation.
Figure 8B:
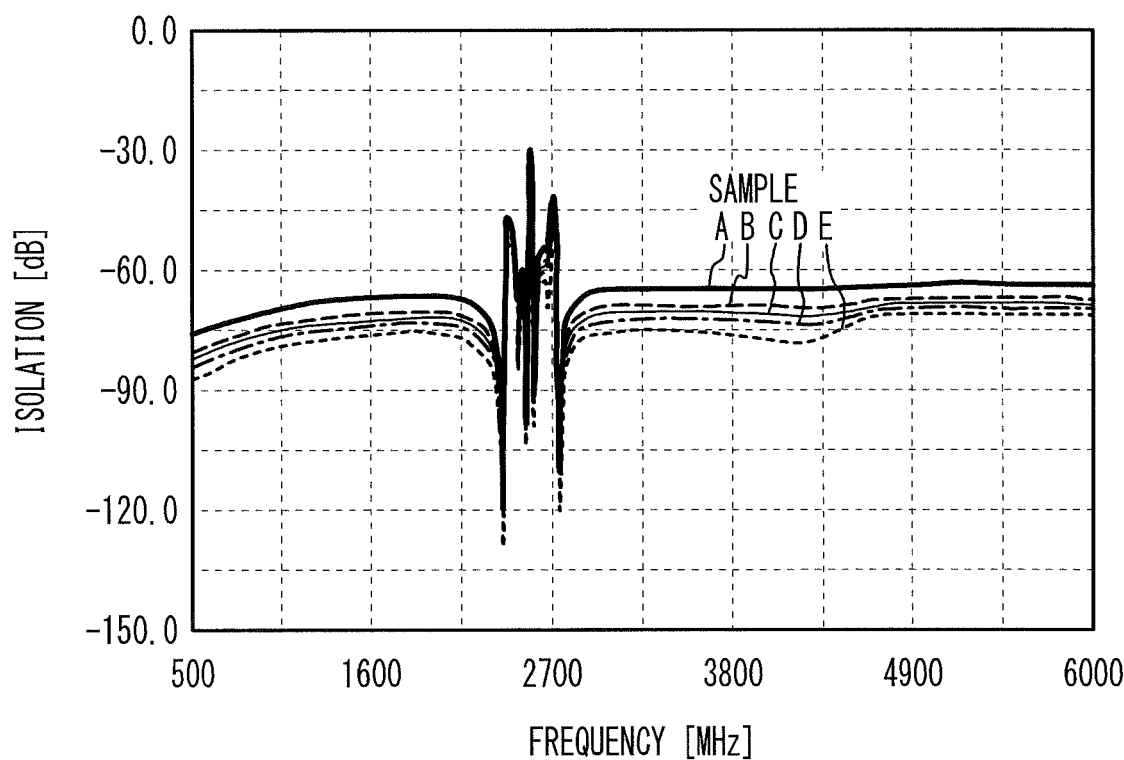

FIG. 8A and FIG. 8B illustrate transmission characteristics and isolation characteristics in the simulation, respectively. FIG. 8A illustrates the transmission characteristics of the transmit filter 50 and the receive filter 52 in the multiplexer. FIG. 8B illustrates the isolation characteristics from the transmit terminal Tx to the receive terminal Rx. A transmit band 76 and a receive band 78 of LTE Band7 are indicated. The simulation is not completely optimized for LTE Band7.

As illustrated in FIG. 8A, the transmission characteristics in the passbands of the transmit filter 50 and the receive filter 52 are almost the same among the samples A through E. This is because the geometric mean of the ratios Cp/Cs was made to be the same among the samples A through E. The attenuation in the receive band 78 of the transmit filter 50 of the sample E is the greatest, followed by the samples D, C, B, and A. The attenuation of the samples D and E is greater than the attenuation of the samples A through C. The attenuation in the transmit band 76 of the receive filter 52 of the sample E is the greatest, followed by the samples D, C, B, and A. As illustrated in FIG. 8B, the isolation characteristic of the sample E is the best, followed by the samples D, C, B, and A. The isolation characteristics of the samples D and E are better than the isolation characteristics of the samples A through C.

Figure 9A:
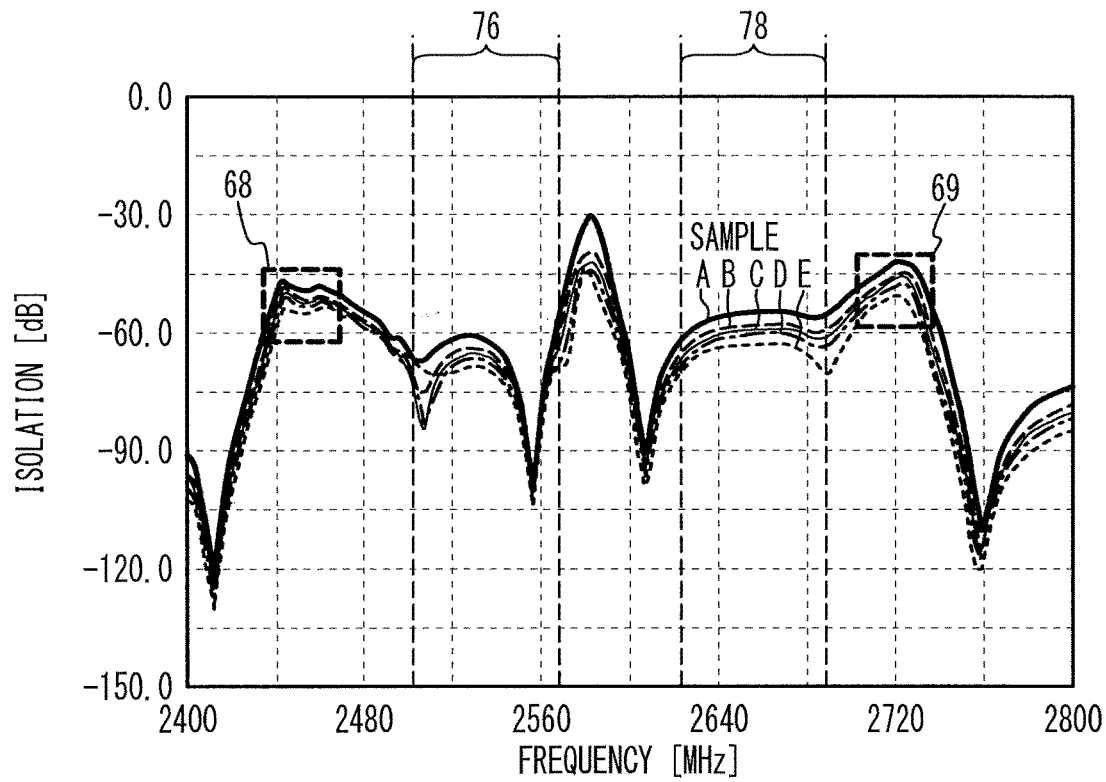
FIG. 9A through FIG. 9C illustrate isolation characteristics in the simulation.
Figure 9B:
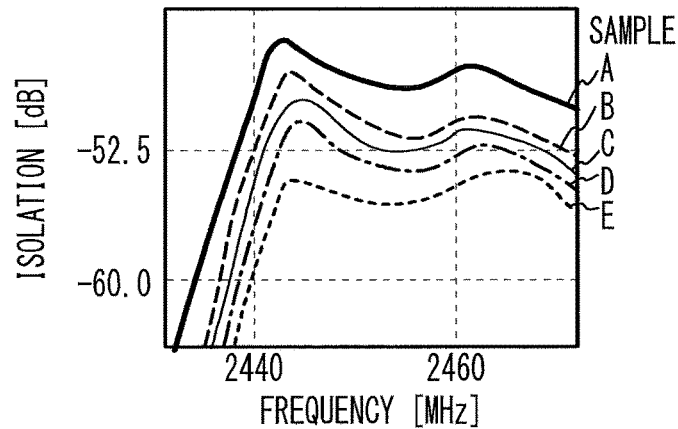
Figure 9C:
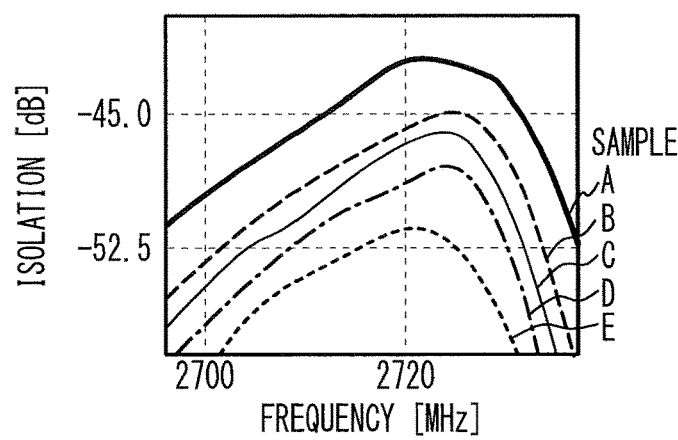

FIG. 9A through FIG. 9C illustrate the isolation characteristics in the simulation. FIG. 9A is an enlarged view near the transmit band 76 and the receive band 78 in FIG. 8B. FIG. 9B and FIG. 9C are enlarged views of ranges 68 and 69 in FIG. 9A, respectively.

As illustrated in FIG. 9A, the isolation characteristics in the transmit band 76 and the receive band 78 of the sample E are the best, followed by the samples D, C, B, and A. As illustrated in FIG. 9B, in the range 68 (around the frequency at which the isolation is the worst at the transmit band 76 side), the worst value of the isolation of the sample E is better than the worst value of the isolation of the sample C by 4.3 dB. As illustrated in FIG. 9C, in the range 69 (around the frequency at which the isolation is the worst at the receive band 78 side), the isolation of the sample E is better than the isolation of the sample C by 4.9 dB.

Figure 10A:
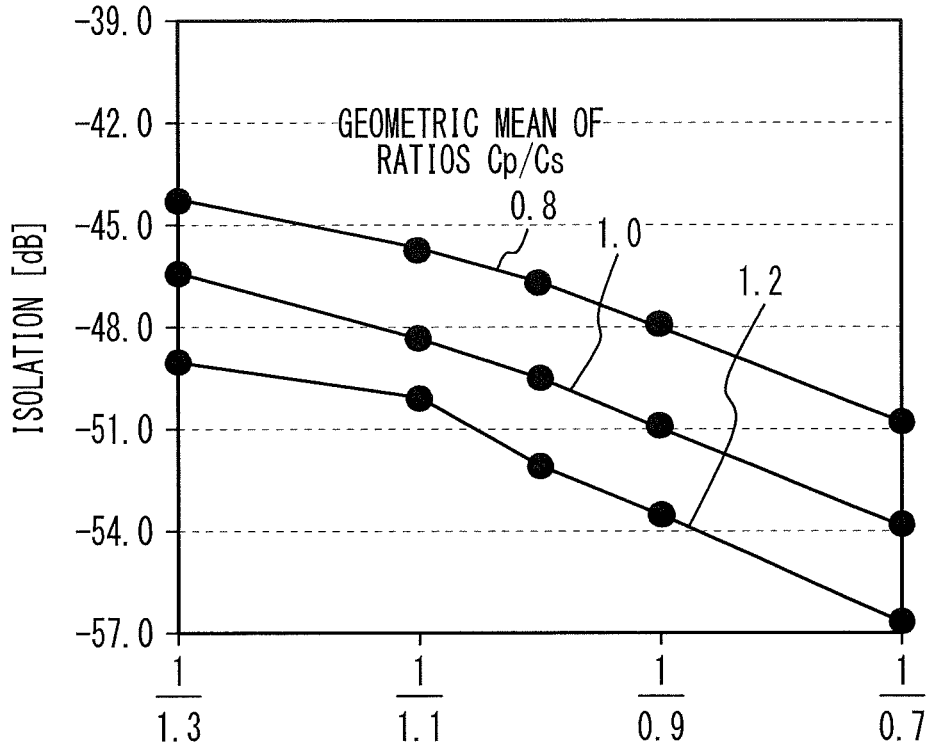
FIG. 10A and FIG. 10B illustrate the worst values of the isolation with respect to ratios $Cp/Cs$ of basic sections 64 through 66 at the transmit band side and the receive band side in the simulation, respectively.
Figure 10B:
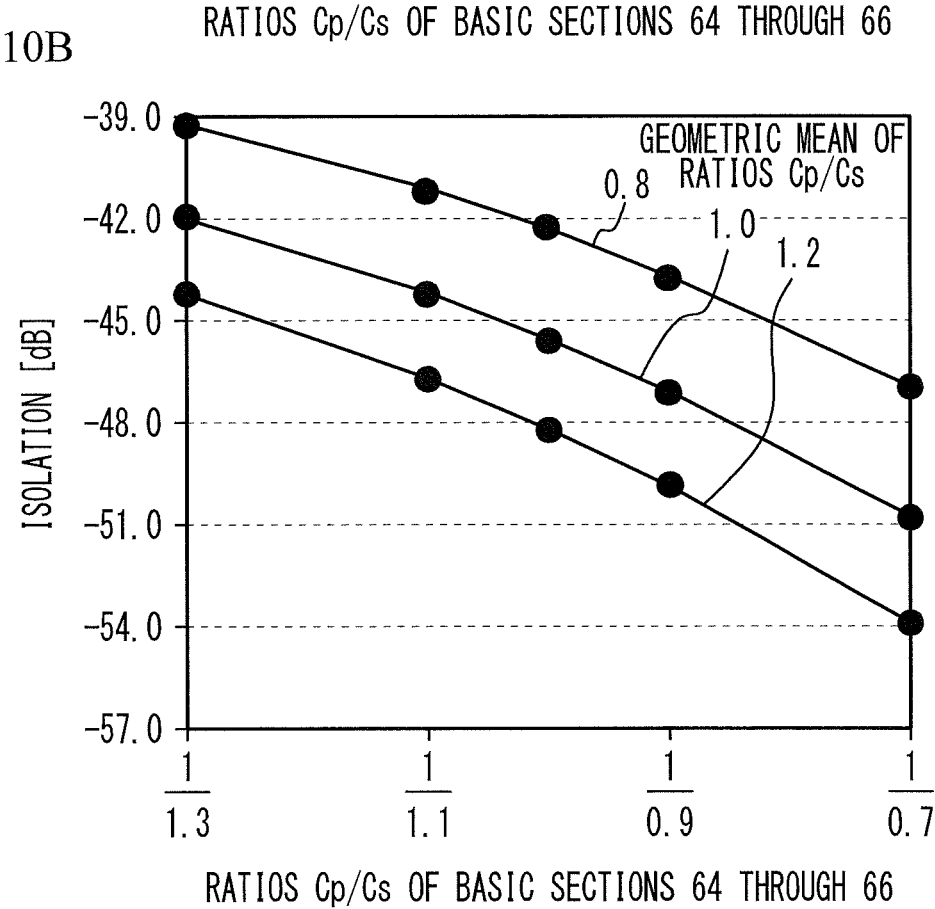

The geometric mean of the ratios Cp/Cs of the basic sections 61 through 66 were configured to be 0.8, 1.0, and 1.2, and the worst value of the isolation was simulated at the transmit band 76 side and the receive band 78 side. FIG. 10A and FIG. 10B illustrate the worst values of the isolation at the transmit band side and the receive band side with respect to the ratios Cp/Cs of the basic sections 64 through 66 in the simulation.

As illustrated in FIG. 10A and FIG. 10B, as the geometric mean of the ratios Cp/Cs of the basic sections 61 through 66 increases, the isolation improves. In addition, as the ratios Cp/Cs in the basic sections 64 through 66 of the part 56 increase, the isolation improves. The sample of which the ratios Cp/Cs in the basic sections 64 through 66 are large is the sample of which the ratios Cp/Cs in the basic sections 61 through 63 are relatively small.

As described above, the samples D and E in which the ratios Cp/Cs of the basic sections 61 through 63 are configured to be less than the ratios Cp/Cs of the basic sections 64 through 66 improve the isolation characteristic compared to the samples A through C without deteriorating the transmission characteristic in the passband. This is because signals in the receive band input from the transmit terminal Tx can be suppressed by the basic sections 64 through 66 by making the ratios Cp/Cs in the basic sections 64 through 66 of the part 56 of the transmit filter 50 greater than the ratios Cp/Cs in the basic sections 61 through 63 of the part 54. This is also because signals in the transmit band leaking to the receive filter 52 in the basic sections 61 through 63 are suppressed in the basic sections 64 through 66 by making the ratios Cp/Cs in the basic sections 64 through 66 of the part 56 of the receive filter 52 greater than the ratios Cp/Cs in the basic sections 61 through 63 of the part 54.

Figure 11A:
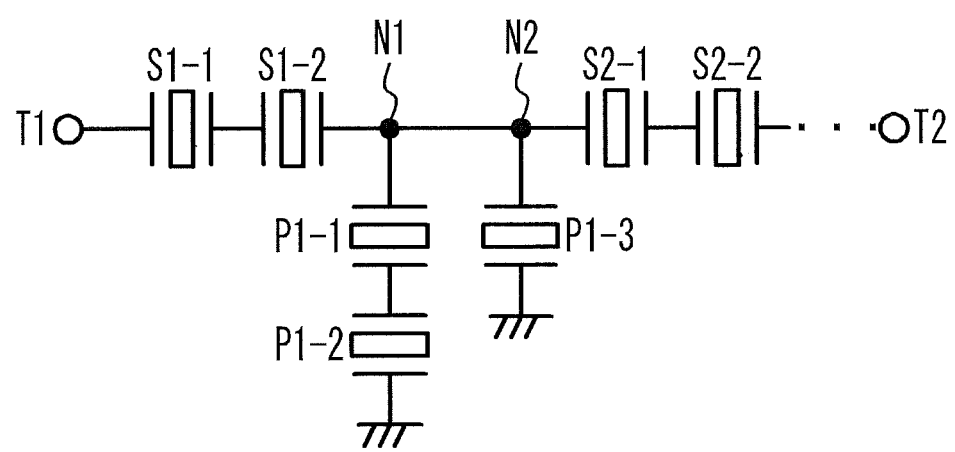
FIG. 11A and FIG. 11B are circuit diagrams illustrating a method of combining series resonators and parallel resonators connected as desired.
Figure 11B:
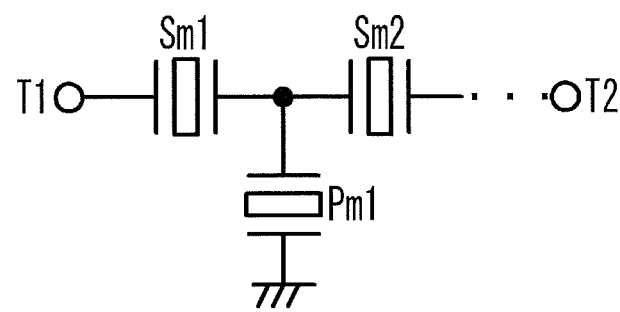

A method of equivalently dividing series resonators and parallel resonators connected as desired into basic sections will be described. FIG. 11A and FIG. 11B are circuit diagrams illustrating a method of combining series resonators and parallel resonators connected as desired. As illustrated in FIG. 11A, series resonators S1-1, S1-2, S2-1, and S2-2 are connected in series between the terminals T1 and T2. Parallel resonators P1-1 and P1-2 are connected in series between a node N1 between the series resonators S1-2 and S2-1 and a ground. A parallel resonator P1-3 is connected between a node N2 and a ground.

As illustrated in FIG. 11B, the series resonators S1-1 and S1-2 are equivalently combined into a composite series resonator Sm1. The series resonators S2-1 and S2-2 are equivalently combined into a composite series resonator Sm2. The parallel resonators P1-1 through P1-3 are equivalently combined into a composite parallel resonator Pm1. The electrostatic capacitance value Cms1 of the composite series resonator Sm1 is expressed by Cms1=(Cs11×Cs12)/(Cs11+Cs12) with use of the electrostatic capacitance value Cs11 of the series resonator S1-1 and the electrostatic capacitance value Cs12 of the series resonator S1-2. The electrostatic capacitance value of the composite series resonator Sm2 is calculated in the same manner. The electrostatic capacitance value Cmp1 of the composite parallel resonator Pm1 is expressed by Cmp1=Cp13+(Cp11×Cp12)/(Cp11+Cp12) with use of the respective electrostatic capacitance values Cp11 through Cp13 of the parallel resonators P1-1 through P1-3.

Figure 12A:
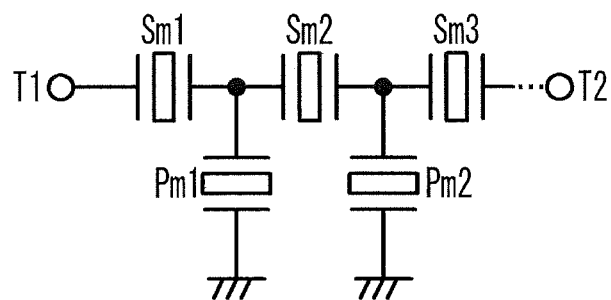
FIG. 12A through FIG. 12C are diagrams for describing a method of dividing a filter into basic sections.
Figure 12B:
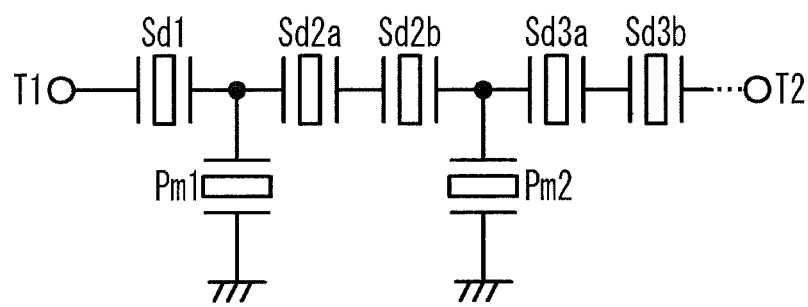
Figure 12C:
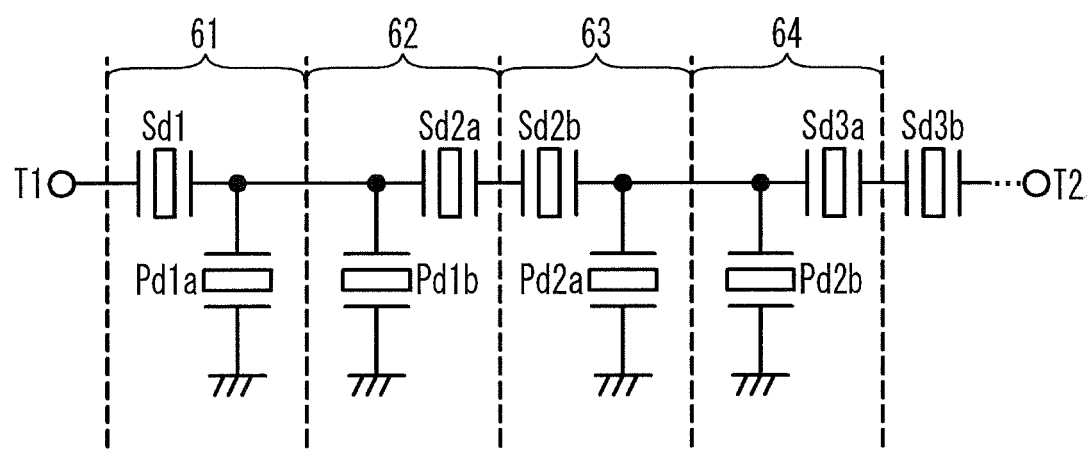

FIG. 12A through FIG. 12C are diagrams for describing a method of dividing a filter into basic sections. As illustrated in FIG. 12A, by combining the series resonators and the parallel resonators, composite series resonators Sm1 through Sm3 and composite parallel resonators Pm1 and Pm2 are alternately connected.

As illustrated in FIG. 12B, the composite series resonator sandwiched between the composite parallel resonators in FIG. 12A is divided in series at the ratio of the electrostatic capacitance values of the composite parallel resonators located at both sides of the composite series resonator. For example, the composite series resonator Sm2 is sandwiched between the composite parallel resonators Pm1 and Pm2. The electrostatic capacitance values of the composite series resonator Sm2 and the composite parallel resonators Pm1 and Pm2 are respectively represented by Cms2, Cmp1, and Cmp2. The electrostatic capacitance values of divided series resonators Sd2a and Sd2b formed by dividing in series the composite series resonator Sm2 are respectively represented by Cds2a and Cds2b. In this case, Cds2a=Cms2×(Cmp1+Cmp2)/Cmp2 and Cds2b=Cms2×(Cmp1+Cmp2)/Cmp1. The composite series resonator Sm3 is also divided in series into divided series resonators Sd3a and Sd3b. Since the composite parallel resonator is not connected to one side of the composite series resonator Sm1, the composite series resonator Sm1 is not divided, but is referred to as a divided series resonator Sd1.

Then, as illustrated in FIG. 12C, the composite parallel resonator sandwiched between the divided series resonators in FIG. 12B is divided in parallel at the ratio of the electrostatic capacitance values of the divided series resonators located at both sides of the composite parallel resonator. For example, the composite parallel resonator Pm1 is sandwiched between the divided series resonators Sd1 and Sd2a. The electrostatic capacitance values of divided parallel resonators Pd1a and Pd1b formed by dividing in parallel the composite parallel resonator Pm1 are respectively represented by Cdp1a and Cdp1b. In this case, Cdp1a=Cmp1×Cds1/(Cds1+Cds2a) and Cdp1b=Cmp1×Cds2a/(Cds1+Cds2a). The composite parallel resonator Pm2 is sandwiched between the divided series resonators Sd2b and Sd3a. The electrostatic capacitance values of divided parallel resonators Pd2a and Pd2b formed by dividing in parallel the composite parallel resonator Pm2 are respectively represented by Cdp2a and Cdp2b. In this case, Cdp2a=Cmp2×Cds2b/(Cds2b+Cds3a) and Cdp2b=Cmp2×Cds3a/(Cds2b+Cds3a).

As described above, the series resonator and the parallel resonator connected as desired can be equivalently expressed by the basic section.

Figure 13:
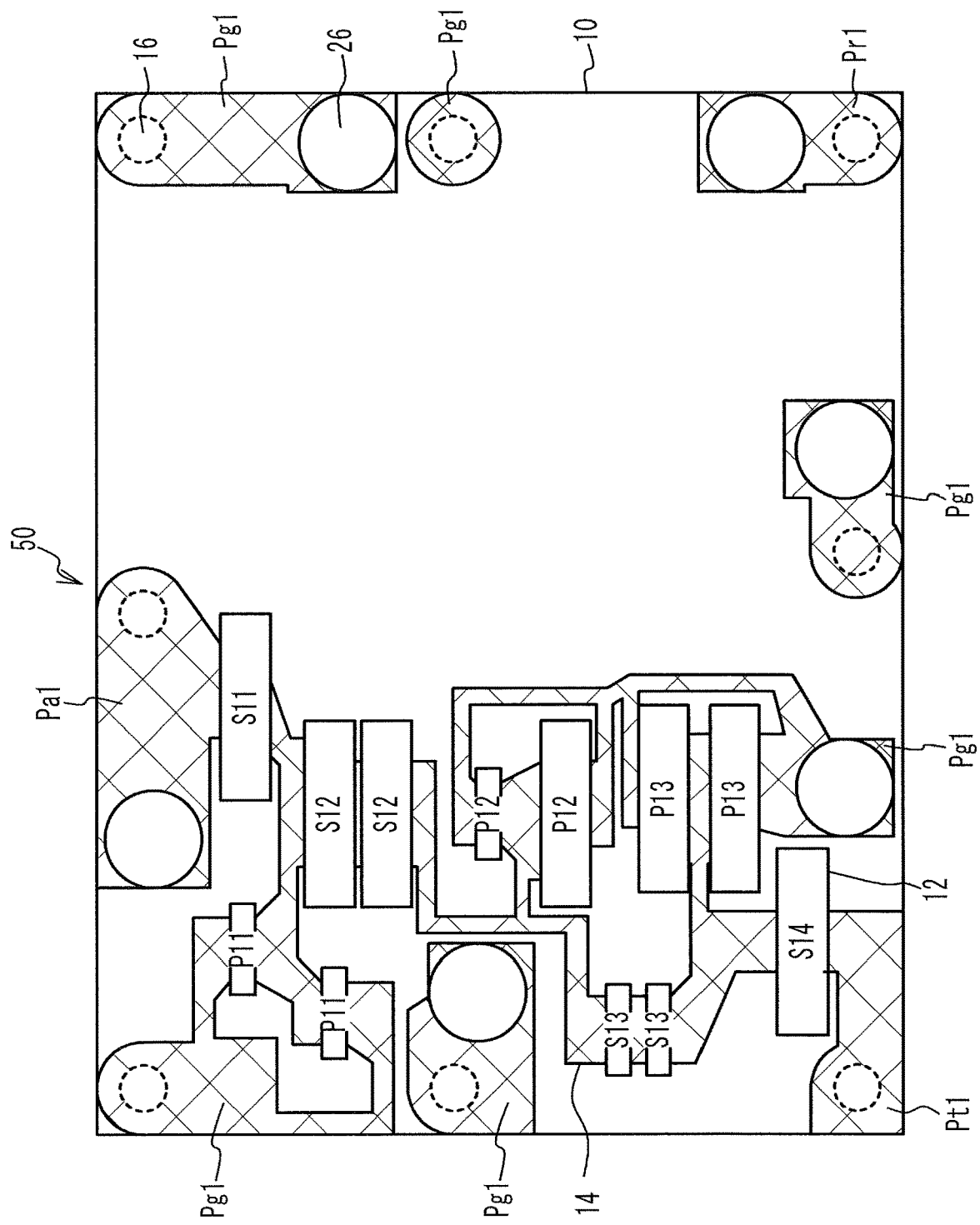
FIG. 13 is a plan view illustrating the upper surface of the substrate 10 in the first embodiment.

FIG. 13 is a plan view illustrating the upper surface of the substrate 10 in the first embodiment. In FIG. 13, the sizes of the acoustic wave resonators 12 are exaggerated. As illustrated in FIG. 13, the acoustic wave resonators 12 and the wiring lines 14 are located on the substrate 10. The via wiring lines 16 and the bumps 26 are coupled to the wiring lines 14. Pads Pa1, Pt1, Pr1, and Pg1 are respectively coupled to the common terminal Ant, the transmit terminal Tx, the receive terminal Rx, and the ground terminal through the via wiring lines 16. Between the pads Pa1 and Pt1, the series resonators S11 through S14 are connected in series and the parallel resonators P11 through P13 are connected in parallel through the wiring lines 14. The series resonators S11 through S14 and the parallel resonators P11 through P13 form the transmit filter 50.

Figure 14:
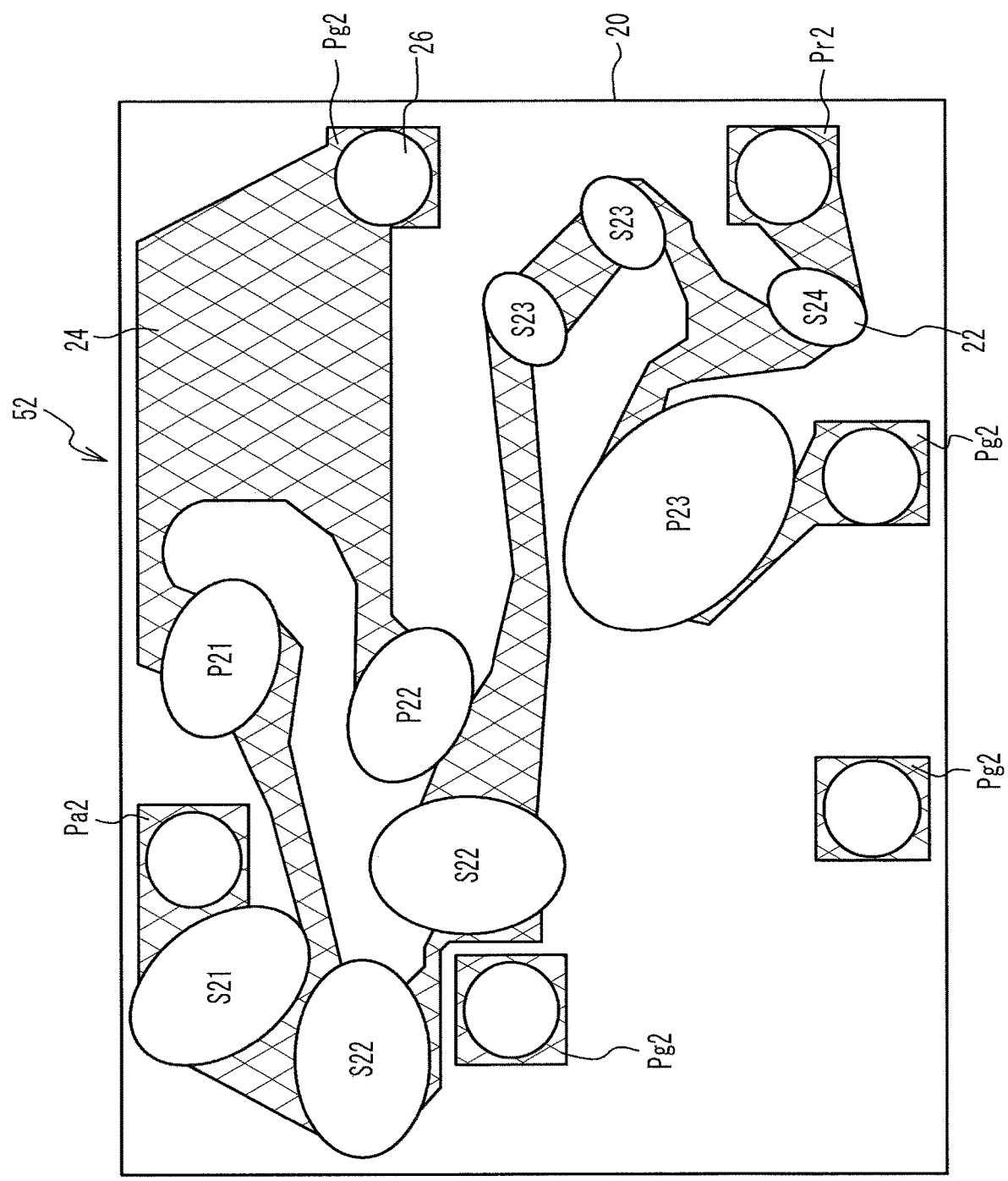
FIG. 14 is a plan view transparently illustrating the lower surface of a substrate 20 in the first embodiment as viewed from above.

FIG. 14 is a plan view transparently illustrating the lower surface of the substrate 20 in the first embodiment as viewed from above. In FIG. 14, the sizes of the acoustic wave resonators 22 are exaggerated. As illustrated in FIG. 14, the acoustic wave resonators 22 and the wiring lines 24 are located on the substrate 20. The bumps 26 are connected to the wiring lines 24. Pads Pa2, Pr2, and Pg2 are respectively coupled to the common terminal Ant, the receive terminal Rx, and the ground terminal through the bumps 26, the wiring lines 14, and the via wiring lines 16. Between the pads Pa2 and Pr2, the series resonators S21 through S24 are connected in series and the parallel resonators P21 through P23 are connected in parallel through the wiring lines 24. The series resonators S21 through S24 and the parallel resonators P21 through P23 form the receive filter 52.

Figure 15:
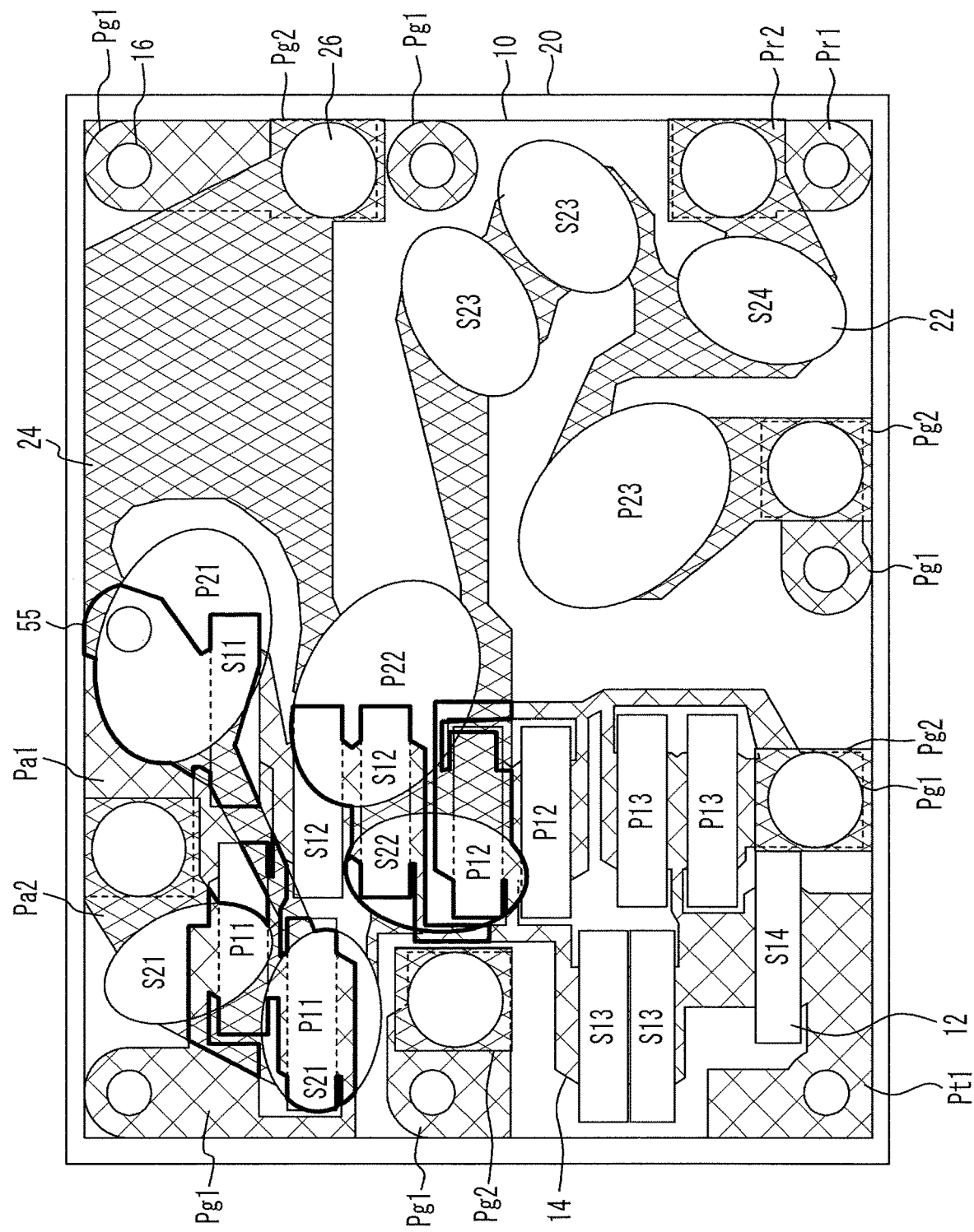
FIG. 15 is a plan view of the multiplexer in accordance with the first embodiment.

FIG. 15 is a plan view of the multiplexer in accordance with the first embodiment. The acoustic wave resonators 22 and the wiring lines 24 of the substrate 20 are superimposed on the substrate 10. The region where the acoustic wave resonator 12 and the wiring line 14 overlap with the acoustic wave resonator 22 and the wiring line 24 is indicated by a bold line 55. As illustrated in FIG. 15, a part of the parallel resonator P11 of the transmit filter 50 overlaps with a part of the series resonator S21 of the receive filter 52 in plan view. A part of the series resonator S11 overlaps with a part of the parallel resonator P21 in plan view. A part of the series resonator S12 overlaps with a part of the parallel resonator P22 in plan view. A part of the parallel resonator P12 overlaps with a part of the series resonator S22 in plan view.

When the acoustic wave resonator 12 (or 22) connected to the wiring line 14 (or 24) that connects the acoustic wave resonator 12 (or 22) to the next acoustic wave resonator 12 (or 22) and overlaps with the acoustic wave resonator 22 (or 12) and/or the wiring line 24 (or 14) is determined to be included in the part 54 (i.e., when the wiring line is taken into consideration), the parallel resonators P11 and P12 and the series resonators S11 through S13 overlap with the acoustic wave resonator 22 and/or the wiring line 24. In the same manner, the parallel resonators P21 and P22 and the series resonators S21 through S23 overlap with the acoustic wave resonator 12 and/or the wiring line 14. Thus, in both the transmit filter 50 and the receive filter 52, the basic sections 61 through 65 are included in the part 54, and the basic section 66 is included in the part 56. Thus, the ratio Cp/Cs in the basic section 66 is configured to be greater than the ratios Cp/Cs in the basic sections 61 through 65. This configuration improves the isolation characteristic.

When the wiring line 14 is not taken into consideration and the acoustic wave resonator 12 (or 22) overlapping with the acoustic wave resonator 22 (or 12) is determined to be included in the part 54, the parallel resonators P11 and P12 and the series resonators S11 and S12 overlap with the acoustic wave resonator 22. In the same manner, the parallel resonators P21 and P22 and the series resonators S21 and S22 overlap with the acoustic wave resonator 12. Accordingly, in both the transmit filter 50 and the receive filter 52, the basic sections 61 through 64 are included in the part 54, and the basic sections 65 and 66 are included in the part 56. Thus, the ratios Cp/Cs in the basic sections 65 and 66 are configured to be greater than the ratios Cp/Cs in the basic sections 61 through 64. This configuration improves the isolation characteristic.

Figure 16:
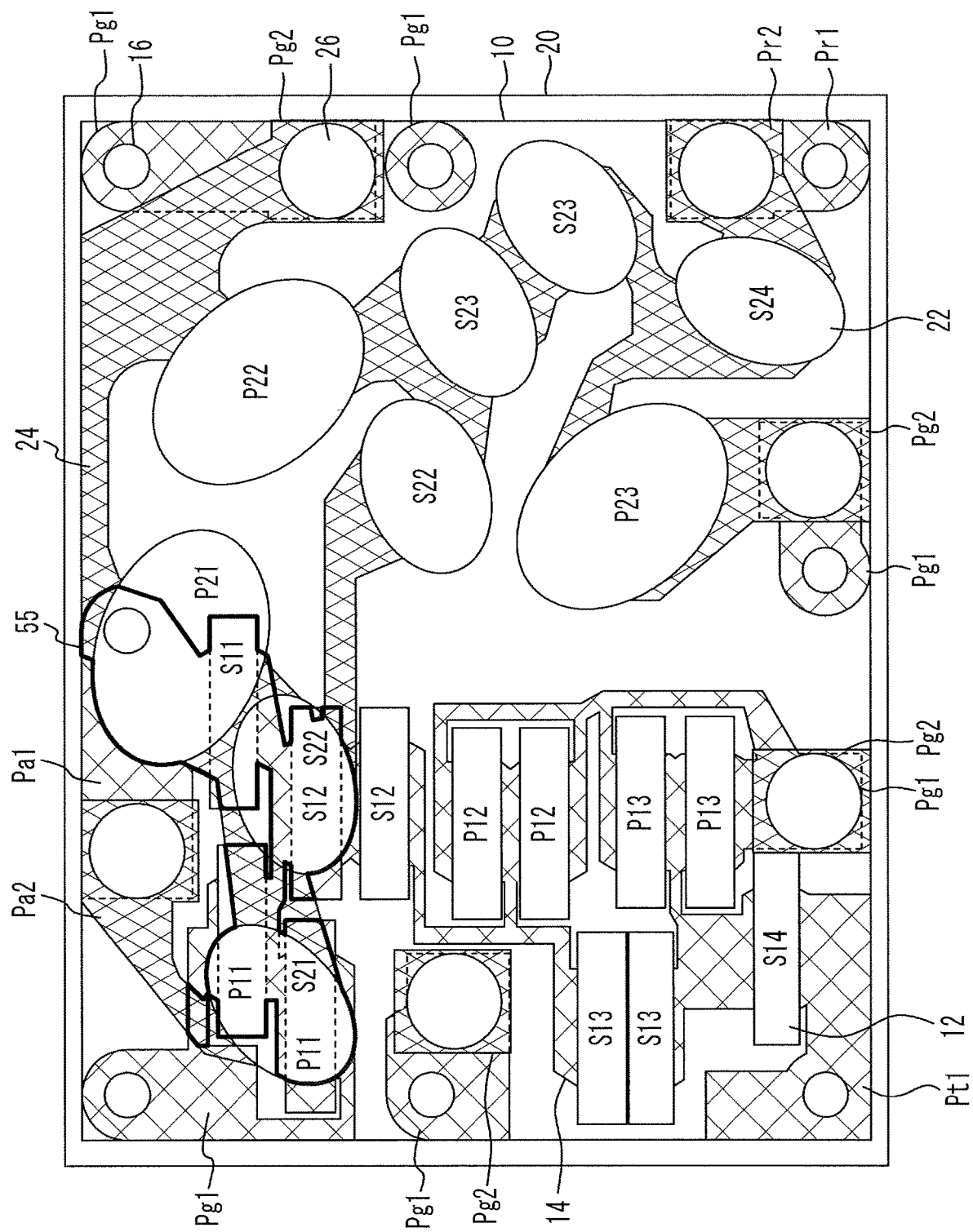
FIG. 16 is a plan view of a multiplexer in accordance with a first variation of the first embodiment.

FIG. 16 is a plan view of a multiplexer in accordance with a first variation of the first embodiment. As illustrated in FIG. 16, a part of the parallel resonator P11 of the transmit filter 50 overlaps with a part of the series resonator S21 of the receive filter 52 in plan view. A part of the series resonator S11 overlaps with a part of the parallel resonator P21 in plan view. A part of the series resonator S12 overlaps with a part of the series resonator S22 in plan view.

When the part 54 is determined taking into consideration the wiring line 14 (or 24) to the next acoustic wave resonator 12 (or 22), the parallel resonator P11 and the series resonators S11 and S12 overlap with the acoustic wave resonator 22 and/or the wiring line 24. Thus, in the transmit filter 50, the basic sections 61 through 63 are included in the part 54, and the basic sections 64 through 66 are included in the part 56. Thus, the ratios Cp/Cs in the basic sections 64 through 66 are configured to be greater than the ratios Cp/Cs in the basic sections 61 through 63. This configuration improves the isolation characteristic.

In the receive filter 52, the parallel resonators P21 and P22 and the series resonators S21 and S22 overlap with the acoustic wave resonator 12 and/or the wiring line 14. Accordingly, in the receive filter 52, the basic sections 61 through 64 are included in the part 54, and the basic sections 65 and 66 are included in the part 56. Thus, the ratios Cp/Cs in the basic sections 65 and 66 are configured to be greater than the ratios Cp/Cs in the basic sections 61 through 64. This configuration improves the isolation characteristic.

When the part 54 is determined without taking into consideration the wiring line 14, the parallel resonator P11 and the series resonators S11 and S12 overlap with the acoustic wave resonator 22. In the same manner, the parallel resonator P21 and the series resonators S21 and S22 overlap with the acoustic wave resonator 12. Accordingly, in both the transmit filter 50 and the receive filter 52, the basic sections 61 through 63 are included in the part 54, and the basic sections 64 through 66 are included in the part 56. Thus, the ratios Cp/Cs in the basic sections 64 through 66 are configured to be greater than the ratios Cp/Cs in the basic sections 61 through 63. This configuration improves the isolation characteristic.

Figure 17:
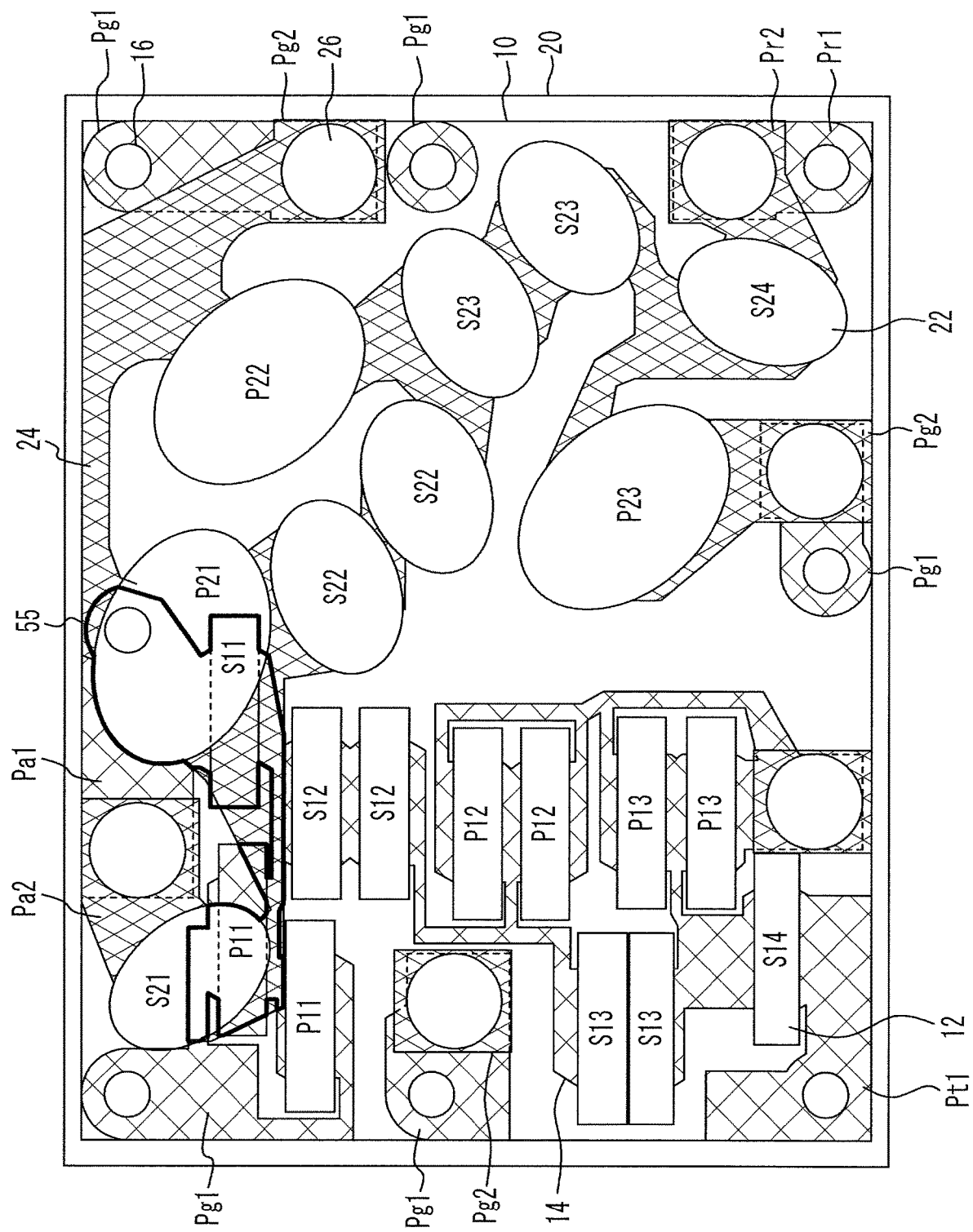
FIG. 17 is a plan view of a multiplexer in accordance with a second variation of the first embodiment.

FIG. 17 is a plan view of a multiplexer in accordance with a second variation of the first embodiment. As illustrated in FIG. 17, a part of the parallel resonator P11 of the transmit filter 50 overlaps with a part of the series resonator S21 of the receive filter 52 in plan view. A part of the series resonator S11 overlaps with a part of the parallel resonator P21 in plan view.

When the part 54 is determined taking into consideration the wiring line, the parallel resonator P11 and the series resonators S11 and S12 overlap with the acoustic wave resonator 22 and/or the wiring line 24. The parallel resonators P21 and P22 and the series resonators S21 and S22 overlap with the acoustic wave resonator 12 and/or the wiring line 14. Accordingly, as in the case of FIG. 16, in the transmit filter 50, the ratios Cp/Cs in the basic sections 64 through 66 are configured to be greater than the ratios Cp/Cs in the basic sections 61 through 63. In the receive filter 52, the ratios Cp/Cs in the basic sections 65 and 66 are configured to be greater than the ratios Cp/Cs in the basic sections 61 through 64. This configuration improves the isolation characteristic.

When the part 54 is determined without taking into consideration the wiring line 14, the parallel resonator P11 and the series resonator S11 overlap with the acoustic wave resonators 22. In the same manner, the parallel resonator P21 and the series resonator S22 overlap with the acoustic wave resonators 12. Accordingly, in both the transmit filter 50 and the receive filter 52, the basic sections 61 and 62 are included in the part 54, and the basic sections 63 through 66 are included in the part 56. Thus, the ratios Cp/Cs in the basic sections 63 through 66 are configured to be greater than the ratios Cp/Cs in the basic sections 61 and 62. This configuration improves the isolation characteristic.

Figure 18A:
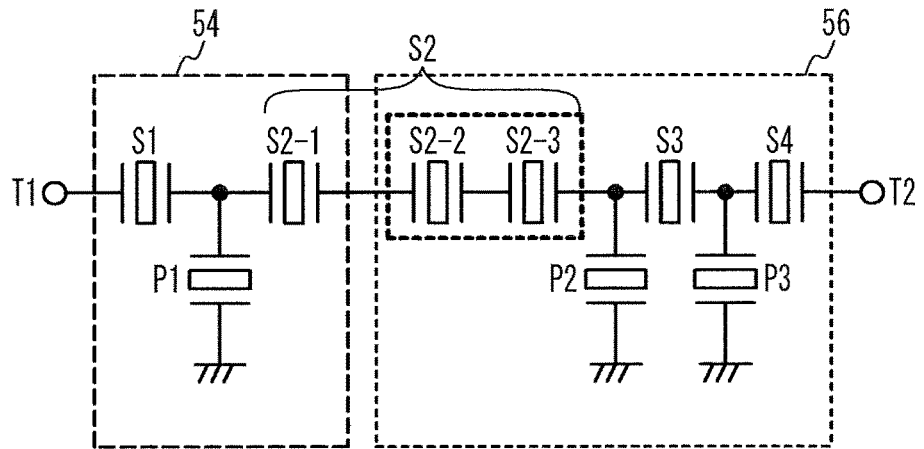
FIG. 18A through FIG. 18C are circuit diagrams illustrating a first method of determining in which part 54 or 56 each basic section is included.
Figure 18B:
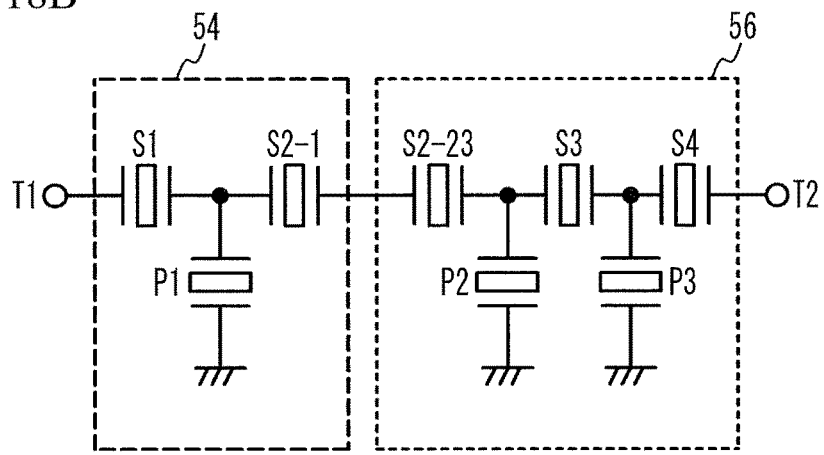
Figure 18C:
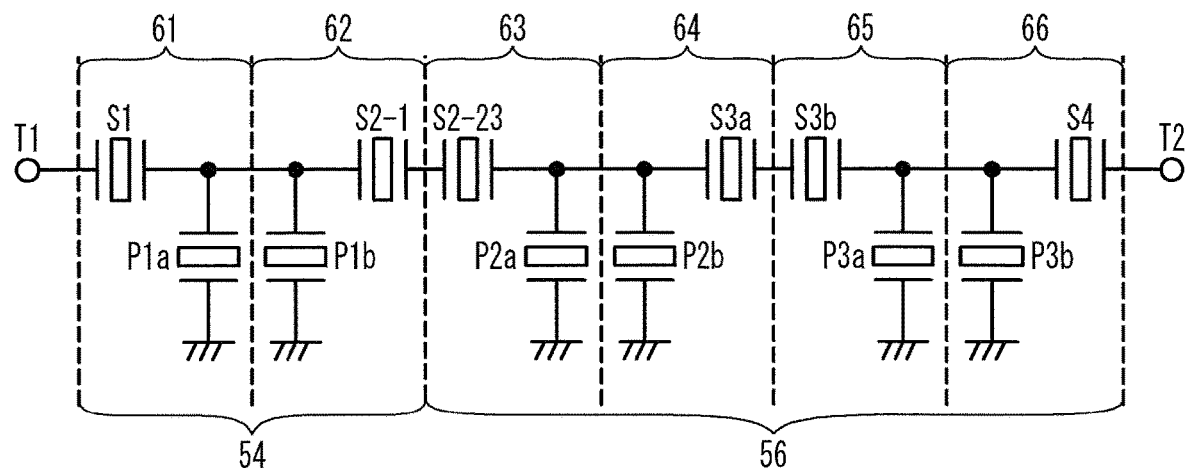

First Method of Determining in which Part 54 or 56 Each Basic Section is Included Next, an exemplary method of determining in which part 54 or 56 each of the basic sections 61 through 66 is included will be described. A case where a series resonator between parallel resonators is divided in series will be described. FIG. 18A through FIG. 18C are circuit diagrams illustrating a first method of determining in which part 54 or 56 each basic section is included. As illustrated in FIG. 18A, the series resonator S2 is divided in series into the series resonators S2-1 through S2-3. Among the series resonators S2-1 through S2-3, the series resonator S2-1 is included in the part 54. That is, the series resonator S2-1 overlaps with the acoustic wave resonator of another filter. The series resonators S2-2 and S2-3 are included in the part 56. That is, the series resonators S2-2 and S2-3 do not overlap with any acoustic wave resonator of another filter.

As illustrated in FIG. 18B, the series resonators S2-2 and S2-3 (indicated by a bold dotted line in FIG. 18A) within the part 56 are combined into a series resonator S2-23. The series resonator S2-23 is included in the part 56.

As illustrated in FIG. 18C, when a filter is equivalently divided into the basic sections 61 through 66, the series resonator S2 is divided into the series resonator S2-1 of the basic section 62 and the series resonator S2-23 of the basic section 63. In the series resonator S2, the series resonator S2-1 in the part 54 and the series resonators S2-2 and S2-3 in the part 56 are not combined. Thus, the basic section 62 including the series resonator S2-1 is determined to be included in the part 54, and the basic section 63 including the series resonators S2-2 and S2-3 is determined to be included in the part 56. Thus, the basic sections 61 and 62 are determined to be included in the part 54, and the basic sections 63 through 66 are determined to be included in the part 56.

As illustrated in FIG. 18A through FIG. 18C, the series resonator S2 between the adjacent parallel resonators P1 and P2 is divided into the series resonators S2-1 through S2-3, and among the series resonators S2-1 through S2-3, the series resonator S2-1 is included in the part 54, and the series resonators S2-2 and S2-3 are included in the part 56. In this case, when the series resonator S2 is divided into the series resonator S2a in the basic section 62 and the series resonator S2b in the basic section 63 (see FIG. 5), the series resonator S2 may be divided so that the series resonators S2a and S2b correspond to the series resonators S2-1 and S2-23.

Figure 19A:
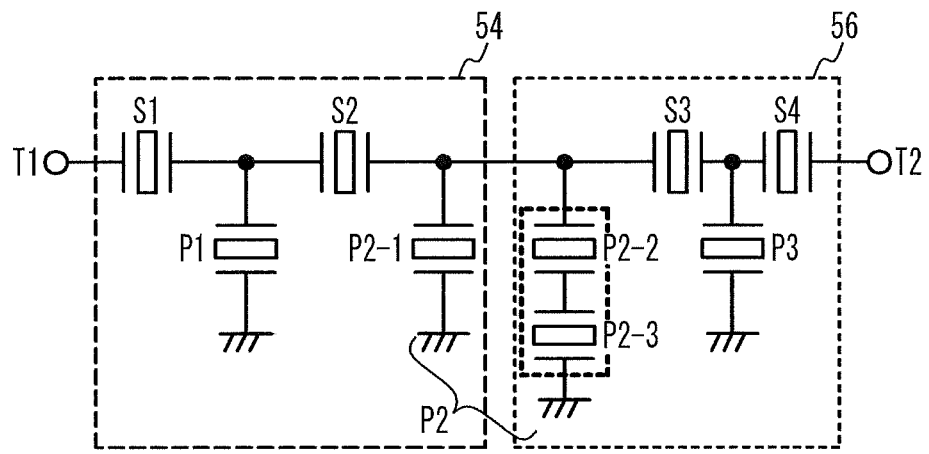
FIG. 19A through FIG. 19C are circuit diagrams illustrating a second method of determining in which part 54 or 56 each basic section is included.
Figure 19B:
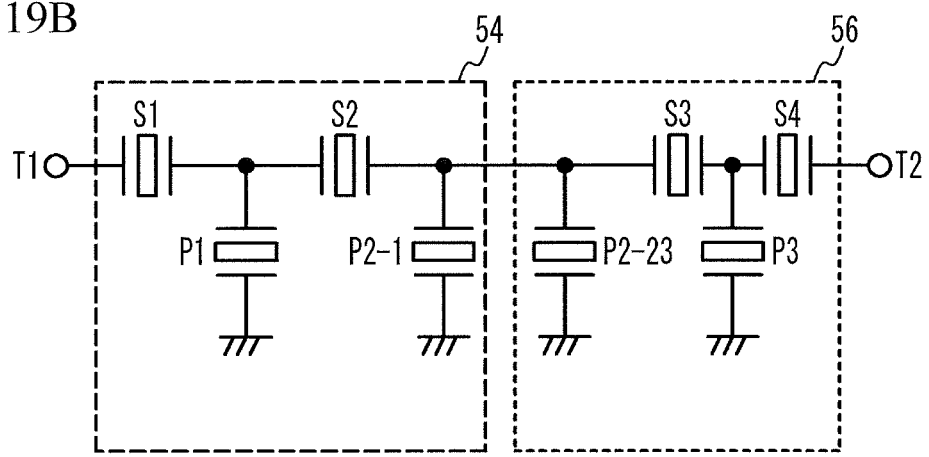
Figure 19C:
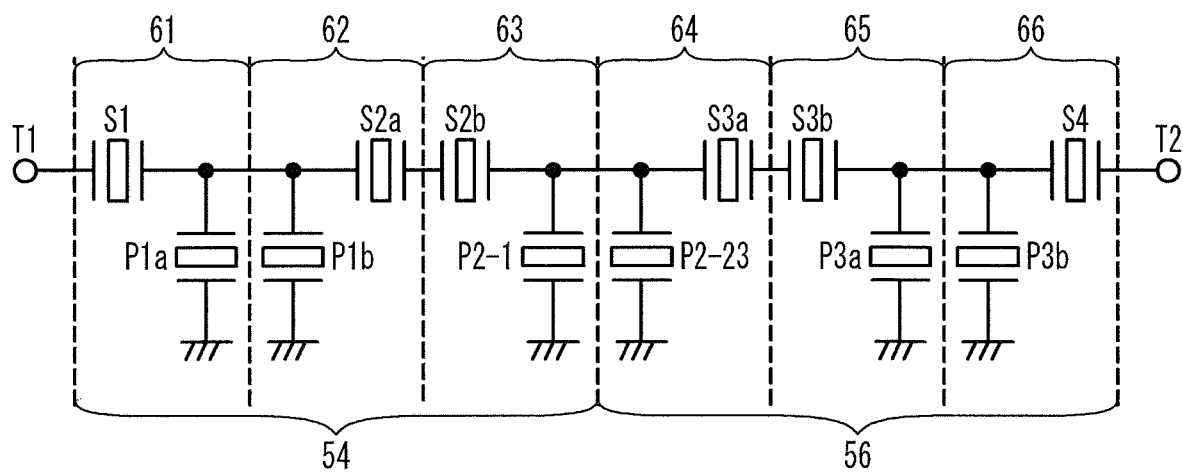

Second Method of Determining in which Part 54 or 56 Each Basic Section is Included A case where a parallel resonator between series resonators is divided in parallel will be described. FIG. 19A through FIG. 19C are circuit diagrams illustrating a second method of determining in which part 54 or 56 each basic section is included. As illustrated in FIG. 19A, the parallel resonator P2 is divided into parallel resonators P2-1 through P2-3. The parallel resonators P2-2 and P2-3 are connected in series. The parallel resonator P2-1 is connected in parallel to the parallel resonators P2-2 and P2-3. The parallel resonator P2-1 is included in the part 54. The parallel resonators P2-2 and P2-3 are included in the part 56.

As illustrated in FIG. 19B, the parallel resonators P2-2 and P2-3 (indicated by a bold dotted line in FIG. 19A) are equivalently combined into a parallel resonator P2-23. The parallel resonator P2-23 is included in the part 56.

As illustrated in FIG. 19C, when a filter is equivalently divided into the basic sections 61 through 66, the parallel resonator P2 is divided into the parallel resonator P2-1 in the basic section 63 and the parallel resonator P2-23 in the basic section 64. In the parallel resonator P2, the parallel resonator P2-1 in the part 54 and the parallel resonators P2-2 and P2-3 in the part 56 are not combined. Thus, the basic section 63 including the parallel resonator P2-1 is determined to be included in the part 54, and the basic section 64 including the parallel resonators P2-2 and P2-3 is determined to be included in the part 56. Accordingly, the basic sections 61 through 63 are determined to be included in the part 54, and the basic sections 64 through 66 are determined to be included in the part 56.

As illustrated in FIG. 19A through FIG. 19C, the parallel resonator P2 between the adjacent series resonators S2 and S3 is divided into the parallel resonators P2-1 through P2-3. Among the parallel resonators P2-1 through P2-3, the parallel resonator P2-1 is included in the part 54, and the parallel resonators P2-2 and P2-3 are included in the part 56. In this case, when the parallel resonator P2 is divided into the parallel resonator P2a in the basic section 63 and the parallel resonator P2b in the basic section 64 (see FIG. 5), the parallel resonator P2 may be divided so that the parallel resonators P2a and P2b correspond to the parallel resonators P2-1 and P2-23.

Figure 20A:
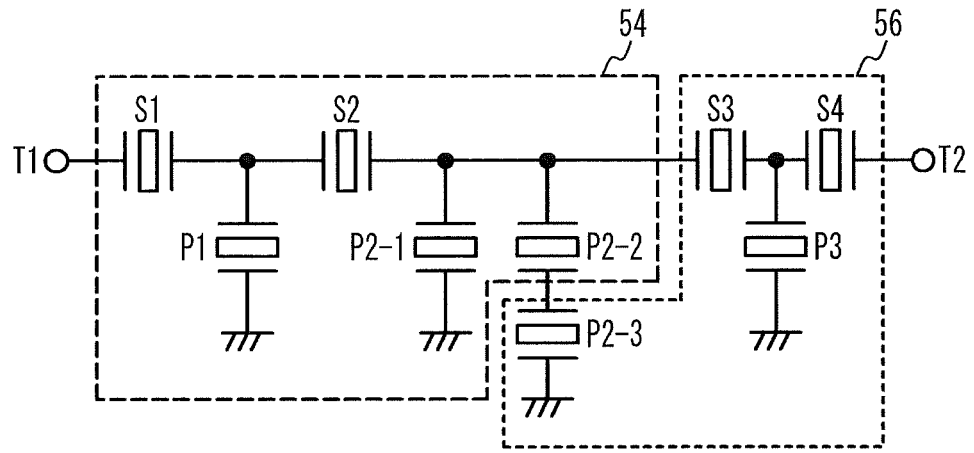
FIG. 20A through FIG. 20C are circuit diagrams illustrating a third method of determining in which part 54 or 56 each basic section is included.
Figure 20B:
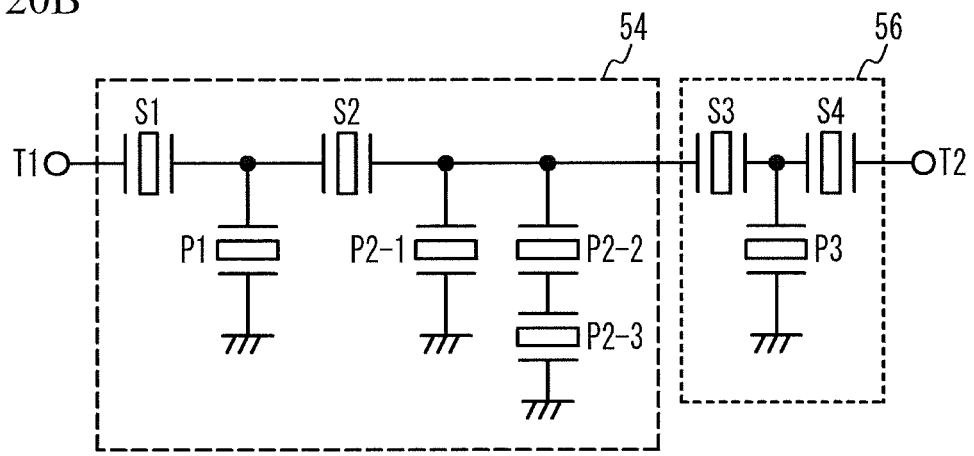
Figure 20C:
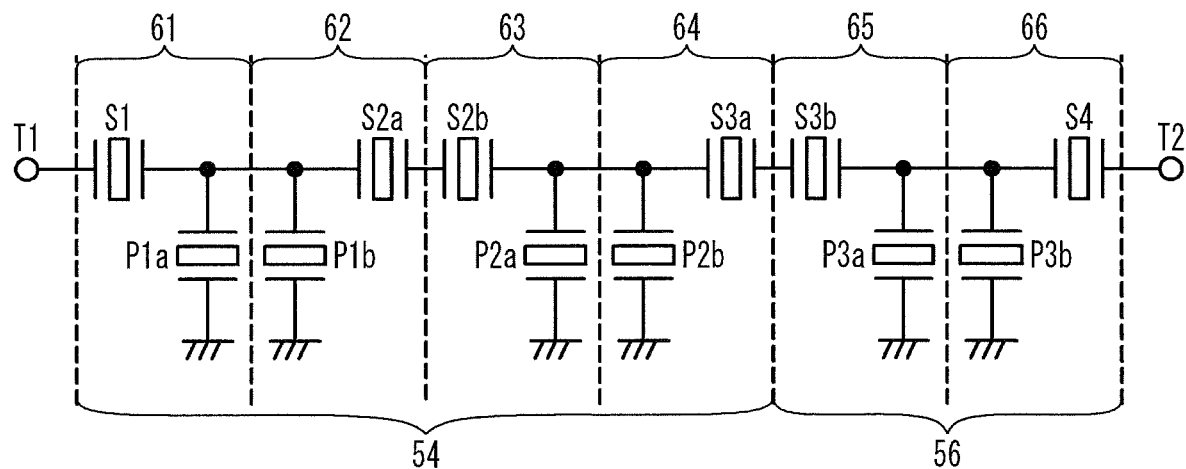

Third Method of Determining in which Part 54 or 56 Each Basic Section is Included A case where a parallel resonator between series resonators is divided in parallel will be described. FIG. 20A through FIG. 20C are circuit diagrams illustrating a third method of determining in which part 54 or 56 each basic section is included. As illustrated in FIG. 20A, a circuit is the same as the circuit illustrated in FIG. 19A. The parallel resonators P2-1 and P2-2 are included in the part 54. The parallel resonator P2-3 is included in the part 56.

As illustrated in FIG. 20B, one or some of the parallel resonators P2-2 and P2-3 that are divided in series are included in the part 54, and the remaining parallel resonator is included in the part 56. In this case, the parallel resonator P2-3 is determined to be included in the part 54.

As illustrated in FIG. 20C, the parallel resonators P2-1 through P2-3 are combined, and thereafter, as with the same method as the method illustrated in FIG. 12A through FIG. 12C, the filter is divided into the basic sections 61 through 66. Since the parallel resonator P2 is included in the part 54, the basic sections 61 through 64 are determined to be included in the part 54, and the basic sections 65 and 66 are determined to be included in the part 56.

As illustrated in FIG. 20A through FIG. 20C, when the parallel resonator P2 between the adjacent series resonators S2 and S3 is divided in parallel, one parallel resonator of the parallel-divided resonators is further divided into the parallel resonators P2-2 and P2-3, and the parallel resonators P2-2 and P2-3 are included in different parts 54 and 56, it is determined that both the parallel resonators P2-2 and P2-3 are included in the part 54. In this case, it may be determined that the parallel resonators P2-2 and P2-3 are included in the part 56.

Figure 21A:
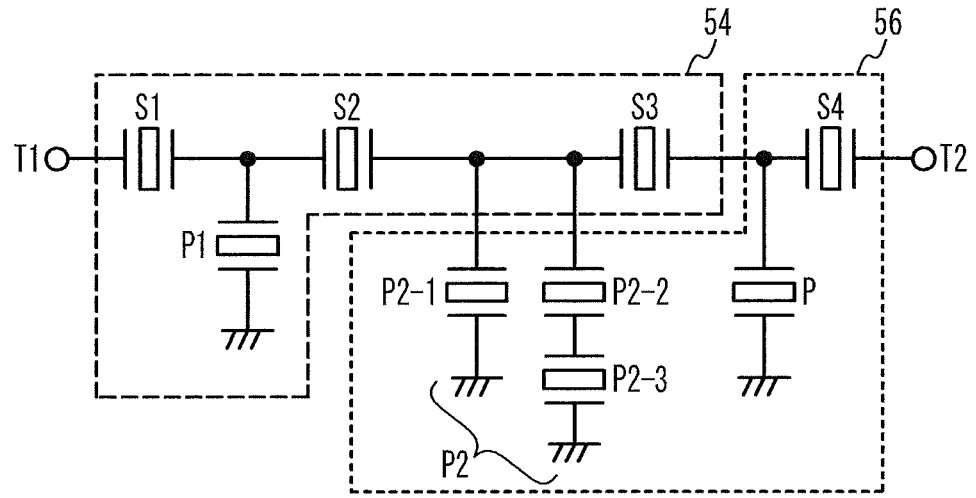
FIG. 21A through FIG. 21C are circuit diagrams illustrating a fourth method of determining in which part 54 or 56 each basic section is included.
Figure 21B:
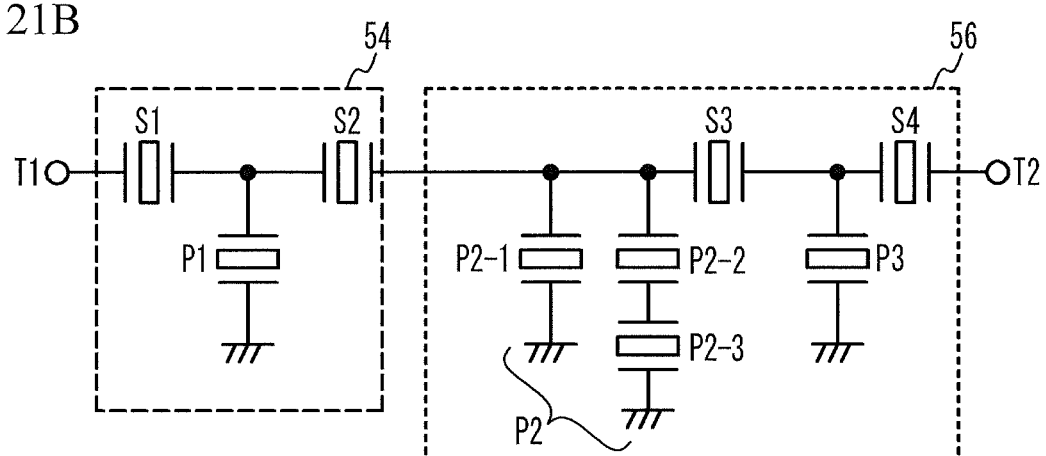
Figure 21C:
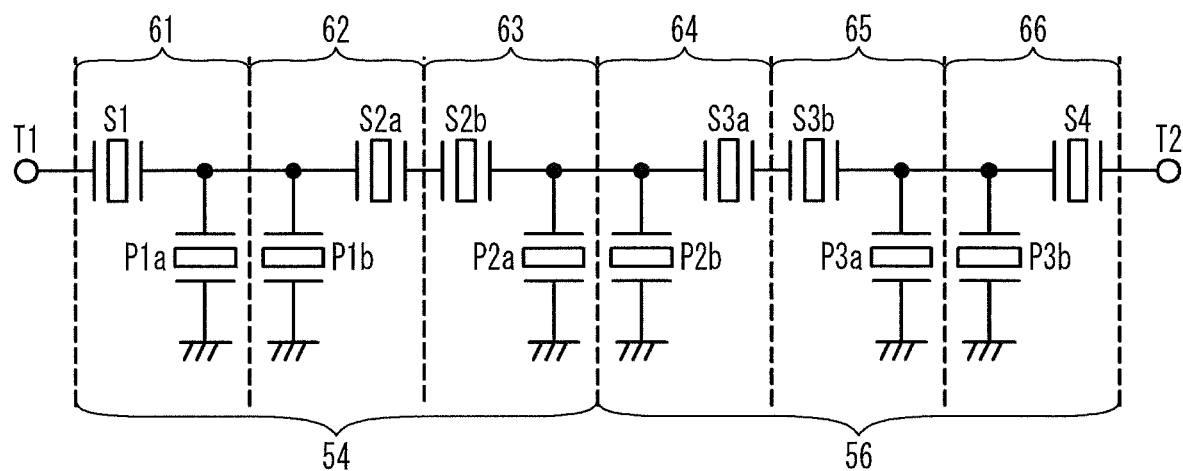

Fourth Method of Determining in which Part 54 or 56 Each Basic Section is Included FIG. 21A through FIG. 21C are circuit diagrams illustrating a fourth method of determining in which part 54 or 56 each basic section is included. As illustrated in FIG. 21A, a circuit is the same as the circuit illustrated in FIG. 19A. The series resonators S1 through S3 and the parallel resonator P1 are included in the part 54. A series resonator S4 and the parallel resonators P2-1 through P3 are included in the part 56. As described above, the series resonator S3 is included in the part 54, but the parallel resonator P3 is included in the part 56.

As illustrated in FIG. 21B, when the parallel resonator of the parallel resonator and the series resonator that are alternately connected is included in the part 56, the series resonator S3 is determined to be included in the part 56.

As illustrated in FIG. 21C, the parallel resonators P2-1 through P2-3 are combined, and thereafter, the filter is divided into the basic sections 61 through 66 by the same method as the method illustrated in FIG. 12A through FIG. 12C. Since the series resonator S2 is included in the part 54, the basic sections 61 through 63 are determined to be included in the part 54, and the basic sections 64 through 66 are determined to be included in the part 56.

As illustrated in FIG. 21A through FIG. 21C, when the adjacent series resonators S2 and S3 are included in the part 54 and the parallel resonator P2 between the series resonators S2 and S3 is included in the part 56, the series resonator S3 may be determined to be included in the part 56. In this case, the parallel resonator P2 and the series resonator S3 may be determined to be included in the part 54.

Figure 22A:
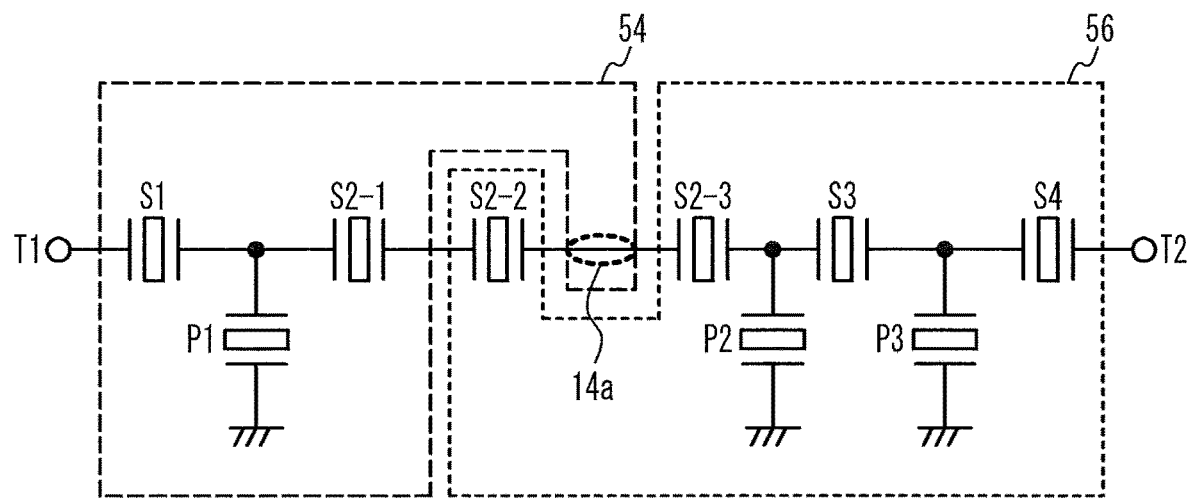
FIG. 22A and FIG. 22B are circuit diagrams illustrating a fifth method of determining in which part 54 or 56 each basic section is included.
Figure 22B:
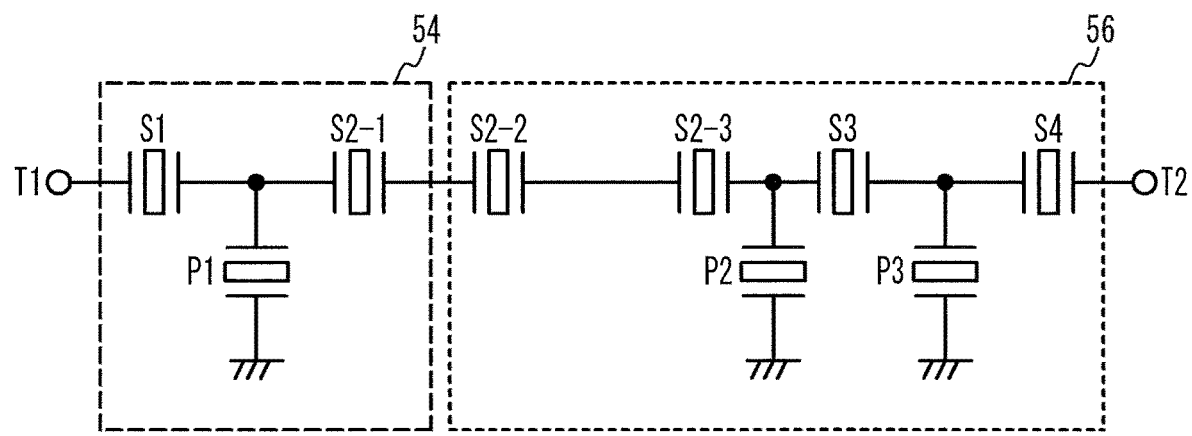

Fifth Method of Determining in which Part 54 or 56 Each Basic Section is Included A case where a part of the wiring line is included in the part 54 will be described. FIG. 22A through FIG. 22B are circuit diagrams illustrating a fifth method of determining in which part 54 or 56 each basic section is included. As illustrated in FIG. 22A, a circuit is the same as the circuit illustrated in FIG. 18A. Among the series resonators S2-1 through S2-3 formed by dividing the series resonator S2, the series resonator S2-1 is included in the part 54, and the series resonators S2-2 and S2-3 are included in the part 56. A wiring line 14a between the series resonators S2-2 and S2-3 is included in the part 54. That is, the wiring line 14a between the series resonators S2-2 and S2-3 overlaps with the acoustic wave resonator of another filter.

As illustrated in FIG. 22B, it is determined that the series resonators S2-2 and S2-3 and the wiring line 14a are determined to be included in the part 56. Thereafter, the filter is divided into the basic sections 61 through 66 in the same manner as FIG. 18B and FIG. 18C.

As illustrated in FIG. 22A and FIG. 22B, when none of the adjacent resonators (the series resonators S2-2 and S2-3) overlap with the acoustic wave resonator and the wiring line of another filter, even if a part of the wiring line 14a between the adjacent resonators overlaps with the acoustic wave resonator and/or the wiring line of another filter, the adjacent resonators may be determined to be included in the part 56. In this case, both the adjacent resonators may be determined to be included in the part 54.

The methods described in FIG. 11A through FIG. 12C are considered as the fundamental methods for a method of equivalently dividing the series resonators and the parallel resonators of the transmit filter 50 and the receive filter 52 into the basic sections 61 through 66 and a method of determining in which part 54 or 56 each of the basic sections 61 through 66 is included, and the methods described in FIG. 18A through FIG. 22B may be used as exceptional methods.

As described above, in the first embodiment and the variations thereof, a lower surface (a first surface) of the substrate 20 (a first substrate) and an upper surface (a second surface) of the substrate 10 (a second substrate) face each other across the air gap 28. The receive filter 52 (a first filter) is located on the lower surface of the substrate 20, and includes one or more series resonators S21 through S24 (first series resonators) connected in series through at least a part of the wiring line 24 (a first wiring line) between the common terminal Ant and the receive terminal Rx (a first terminal) and one or more parallel resonators P21 through P23 (first parallel resonators) connected in parallel through at least a part of the wiring line 24 between the common terminal Ant and the receive terminal Rx. The transmit filter 50 (a second filter) is located on the upper surface of the substrate 10, and includes one or more series resonators S11 through S14 (second series resonators) connected in series through at least a part of the wiring line 14 (a second wiring line) between the common terminal Ant and the transmit terminal Tx (a second terminal) and one or more parallel resonators P11 through P13 (second parallel resonators) connected in parallel through at least a part of the wiring line 14 between the common terminal Ant and the transmit terminal Tx.

As illustrated in FIG. 15 through FIG. 17, at least a part of each of one or more first resonators (for example, S11, S12, P11 and P12 in FIG. 15) among the series resonators S11 through S14 and the parallel resonator P11 through P13 overlaps with at least a part of the series resonators S21 through S24 and the parallel resonators P21 through P23 in plan view. One or more second resonators (for example, S13, S14, P12 and P13 in FIG. 15) other than the one or more first resonators among the series resonators S11 through S14 and the parallel resonators P11 through P13 overlap with none of the series resonators S21 through S24 and the parallel resonators P21 through P23 in plan view.

When the series resonators S11 through S14 and the parallel resonators P11 through P13 are expressed by an equivalent circuit composed of basic sections mirror-symmetrically connected, the electrostatic capacitance values of the series resonator and the parallel resonator in one or more first basic sections (for example, the basic sections 61 through 63 in FIG. 5) including one or more first resonators (for example, S11, S12, P11 and P12 in FIG. 15) are represented by Cs1 and Cp1, respectively. The electrostatic capacitance values of the series resonator and the parallel resonator in one or more second basic sections (for example, the basic sections 64 and 65 in FIG. 5) including one or more second resonators (for example, S13, S14, P12 and P13 in FIG. 15) and not including one or more first resonators are represented by Cs2 and Cp2, respectively. In this case, as illustrated in FIG. 14, at least one of the ratios Cp1/Cs1 is configured to be less than at least one of the ratios Cp2/Cs2.

This configuration suppresses signals in the receive band of the transmit filter 50 in the basic sections 64 through 66 of which the ratios Cp2/Cs2 are large. Thus, the isolation characteristic is improved. In addition, the ratios Cp1/Cs1 of the basic sections 61 through 63 are reduced. This configuration enables to set the geometric mean of the ratios Cp/Cs of the transmit filter 50 so that the desired characteristics of the transmit filter 50 are achieved.

The maximum value of the ratios Cp1/Cs1 of the one or more first resonators is preferably less than the minimum value of the ratios Cp2/Cs2 of the one or more second resonators. The geometric mean of the ratios Cp1/Cs1 of the one or more first resonators is preferably less than the geometric mean of the ratios Cp2/Cs2 of the one or more second resonators.

As described in FIG. 15 through FIG. 17, at least one of each of the one or more first resonators (for example, S11, S12, P11 and P12 in FIG. 15) may overlap with at least a part of the series resonators S21 through S24 and/or at least a part of the one or more parallel resonators P11 through P13 in plan view.

In each of the one or more first resonators, at least a part of a corresponding first resonator and/or at least a part of the wiring line 24 adjacent to the corresponding first resonator may overlap with at least a part of the series resonators S11 through S14, at least a part of the parallel resonators P11 through P13, and/or at least a part of the wiring line 14 in plan view. The one or more second resonators other than the one or more first resonators and/or the wiring line 24 adjacent to the one or more second resonators may overlap with none of the one or more series resonators S11 through S14, the parallel resonator P11 through P13, and the wiring line 14 in plan view.

A wiring line adjacent to a resonator is the wiring line between the resonator and a resonator adjacent to the resonator or the wiring line between the resonator and a terminal. For example, in FIG. 1, the wiring line adjacent to the series resonator S21 is a wiring line between the series resonator S21 and the common terminal Ant, a wiring line between the series resonators S21 and S22, and a wiring line between the series resonator S21 and the parallel resonator P21. These wiring lines have electric potentials approximately equal to that of the series resonator S11, and when these wiring lines overlap with the resonator and/or the wiring line on the substrate 10 in plan view, high-frequency signals interfere with the receive filter 52.

As illustrated in FIG. 15 through FIG. 17, one or more second resonators include the series resonator S24, which is closest to the transmit terminal Tx in terms of electric connection among the series resonators S21 through S24, and the parallel resonator P23, which is closest to the transmit terminal Tx in terms of electric connection among the parallel resonators P21 through P23. This configuration suppresses signals in the receive band in at least the basic section 66.

All the one or more first resonators are closer to the common terminal Ant in terms of electric connection than any of the one or more second resonators. This configuration suppresses signals in the receive band in the basic section closer to the transmit terminal Tx. Thus, the isolation characteristic is further improved.

The equivalent circuit composed of the basic sections mirror-symmetrically connected is calculated as follows. As illustrated in FIG. 11A and FIG. 11B, one or more series resonators S1-1, S1-2, S2-1, and S2-2 and one or more parallel resonators P1-1 through P1-3 are combined so that one or more composite series resonators Sm1 and Sm2 and one or more composite parallel resonators Pm1 are alternately connected.

Then, as illustrated in FIG. 12A and FIG. 12B, the composite series resonator Sm2, which has a first end to which the composite parallel resonator Pm1 (a first composite parallel resonator) with an electrostatic capacitance value of Cmp1 is connected, has a second end to which the composite parallel resonator Pm2 (a second composite parallel resonator) with an electrostatic capacitance value of Cmp2 is connected, and has an electrostatic capacitance value of Cms, is divided in series into the divided series resonator Sd2a, which is closer to the composite parallel resonator Pm1 and has an electrostatic capacitance value of Cms×(Cmp1+Cmp2)/Cmp2, and the divided series resonator Sd2b, which is closer to the composite parallel resonator Pm2 and has an electrostatic capacitance value of Cms×(Cmp1+Cmp2)/Cmp1. As described above, one or more composite series resonators Sm1 through Sm3 are divided into one or more divided series resonators Sd1 through Sd3b.

Then, the composite parallel resonator Pm1, which has a first end to which the divided series resonator Sd1 (a first divided series resonator) with an electrostatic capacitance value of Cds1 is connected, has a second end to which the divided series resonator Sd2a (a second divided series resonator) with an electrostatic capacitance value of Cds2 is connected, and has an electrostatic capacitance value of Cmp, is divided in parallel into the divided parallel resonator Pd1a, which is closer to the divided series resonator Sd1 and has an electrostatic capacitance value of Cmp×Cds1/(Cds1+ Cds2), and the divided parallel resonator Pd1b, which is closer to the divided series resonator Sd2a and has an electrostatic capacitance value of Cmp×Cds2/(Cds1+Cds2). As described above, the one or more composite parallel resonators Pm1 and Pm2 are divided into one or more divided parallel resonators Pd1a through Pd2b.

As illustrated in FIG. 5, the one or more divided series resonators are determined to be the series resonators in the one or more basic sections 61 through 66, and the one or more divided parallel resonators are determined to be the parallel resonators in the corresponding one of the one or more basic sections 61 through 66. Accordingly, the equivalent circuit composed of the basic sections 61 through 66 mirror-symmetrically connected is calculated.

When the second terminal is, the transmit terminal Tx and the second filter is the transmit filter 50, the ratio Cp1/Cs1 of the basic section 63, which is electrically closest to the transmit terminal Tx among the one or more first basic sections (for example, the basic sections 61 through 63) and overlaps with the receive filter 52 in plan view, is greater than the ratios Cp1/Cs1 of the remaining first basic sections 61 and 62. Signals in the receive band are suppressed in the basic section 63 close to the transmit terminal Tx.

Furthermore, the ratios Cp1/Cs1 of the one or more first basic sections 61 through 63 decrease at electrically closer distances to the common terminal Ant. Thus, signals in the receive band are suppressed in the basic sections 61 through 63 electrically closer to the transmit terminal Tx.

At least a part of each of one or more third resonators (for example, S21, S22, P21 and P22 in FIG. 15) among the series resonators S21 through S24 and the parallel resonators P21 through P23, overlaps with at least a part of the series resonators S11 through S14 and/or at least a part of the parallel resonators P11 through P13 in plan view. One or more fourth resonators (for example, S23, S24 and P23 in FIG. 15) other than the one or more third resonators among the series resonators S21 through S24 and the parallel resonators P21 through P23 overlap with none of the series resonators S11 through S14 and the parallel resonators P11 through P13 in plan view.

When the series resonators S11 through S14 and the parallel resonators P11 through P13 are expressed by an equivalent circuit composed of the basic sections 61 through 66 mirror-symmetrically connected, the electrostatic capacitance values of the series resonator and the parallel resonator in the one or more third basic sections 61 through 63 including the one or more third resonators are represented by Cs3 and Cp3, respectively. The electrostatic capacitance values of the series resonator and the parallel resonator in the one or more fourth basic sections 64 through 66 including the one or more fourth resonators and not including one or more third resonators are represented by Cs4 and Cp4, respectively. In this case, at least one of ratios Cp3/Cs3 of the third resonators is configured to be less than at least one of ratios Cp4/Cs4 of the fourth resonators.

This configuration suppresses signals in the transmit band of the receive filter 52 in the basic sections 64 through 66 of which the ratios Cp4/Cs4 are large. Thus, the isolation characteristic is improved. Additionally, the ratios Cp3/Cs3 of the basic sections 61 through 63 are reduced. This configuration enables to set the overall ratio Cp/Cs of the receive filter 52 so that the desired characteristics of the receive filter 52 are achieved.

The maximum value of the ratios Cp3/Cs3 of the one or more third resonators is preferably less than the minimum value of the ratios Cp4/Cs4 of the one or more fourth resonators. The geometric mean of the ratios Cp3/Cs3 of the one or more third resonators is preferably less than the geometric mean of the ratios Cp4/Cs4 of the one or more fourth resonators.

It is sufficient if in each of the one or more third resonators, at least a part of a corresponding third resonator of the one or more third resonators and/or at least a part of the wiring line 14 adjacent to the corresponding third resonator overlaps with at least a part of the series resonators S21 through S24, at least a part of the parallel resonators P21 through P23, and/or at least a part of the wiring line 24 in plan view. It is sufficient if the one or more fourth resonators other than the one or more third resonators and/or the wiring line 24 adjacent to the one or more fourth resonators overlap with none of the one or more series resonators S21 through S24, the parallel resonators P21 through P23, and the wiring lines 14 in plan view.

As illustrated in FIG. 15 through FIG. 17, one or more fourth resonators include the series resonator S14, which is closest to the receive terminal Rx in terms of electric connection among the series resonators S11 through S14, and the parallel resonator P13, which is closest to the receive terminal Rx in terms of electric connection among the parallel resonators P11 through P13. This configuration suppresses signals in the transmit band at least in the basic section 66.

All the one or more third resonators are closer to the common terminal Ant in terms of electric connection than any of the one or more fourth resonators. This configuration suppresses signals in the transmit band in the basic section closer to the receive terminal Rx. Therefore, the isolation characteristic is further improved.

When the first terminal is the receive terminal Rx and the first filter is the receive filter 52, the ratio Cp1/Cs1 of the basic section 61, which is electrically closest to the common terminal Ant among the one or more third basic sections (for example, the basic sections 61 through 63) and overlaps with the transmit filter 50 in plan view, is greater than the ratios Cp1/Cs1 of other third basic sections 62 and 63. This configuration suppresses signals in the transmit band in the basic section 63 close to the common terminal Ant.

Furthermore, the ratios Cp1/Cs1 of the one or more third basic sections 61 through 63 increase at electrically closer distances to the common terminal Ant. Thus, signals in the transmit band are suppressed in the basic sections 61 through 63 electrically closer to the common terminal Ant.

The first embodiment and the variations thereof describe a case where the first filter is the receive filter 52 and the second filter is the transmit filter 50, but the first filter may be the transmit filter 50 and the second filter may be the receive filter 52. The number of the series resonators and the parallel resonators constituting the ladder-type filter can be freely selected. The acoustic wave resonators of the first filter and the second filter may be surface acoustic wave resonators, or piezoelectric thin film resonators. A case where the sealing portion 30 is located so as to surround the substrate 20 is described, but the sealing portion 30 may not be necessarily provided. A duplexer has been described as an example of the multiplexer, but the multiplexer may be a triplexer or a quadplexer. The first filter and the second filter are at least two filters of the multiplexer.

Although the embodiments of the present invention have been described in detail, it is to be understood that the various change, substitutions, and alterations could be made hereto without departing from the spirit and scope of the invention.

What is claimed is:

1. A multiplexer comprising:
a first substrate having a first surface;
a second substrate having a second surface, the second surface facing the first surface across an air gap;
a first filter located on the first surface and including one or more first series resonators and one or more first parallel resonators, the one or more first series resonators being connected in series through at least a part of a first wiring line between a common terminal and a first terminal, the one or more first parallel resonators being connected in parallel through at least a part of the first wiring line between the common terminal and the first terminal; and
a second filter located on the second surface and including one or more second series resonators and one or more second parallel resonators,
the one or more second series resonators being connected in series through at least a part of a second wiring line between the common terminal and a second terminal, the one or more second parallel resonators being connected in parallel through at least a part of the second wiring line between the common terminal and the second terminal,
in each of one or more first resonators among the one or more second series resonators and the one or more second parallel resonators, at least a part of a corresponding first resonator of the one or more first resonators and/or at least a part of a third wiring line adjacent to the corresponding first resonator overlapping with at least a part of the one or more first series resonators, at least a part of the one or more first parallel resonators, and/or at least a part of the first wiring line in plan view, the second wiring line including the third wiring line,
in each of one or more second resonators other than the one or more first resonators among the one or more second series resonators and the one or more second parallel resonators, a corresponding second resonator of the one or more second resonators and a fourth wiring line adjacent to the corresponding second resonator overlapping with none of the one or more first series resonators, the one or more first parallel resonators, and the first wiring line in the plan view, the second wiring line including the fourth wiring line,
when the one or more second series resonators and the one or more second parallel resonators are expressed by an equivalent circuit composed of basic sections mirror-symmetrically connected, electrostatic capacitance values of a series resonator and a parallel resonator in one or more first basic sections including the one or more first resonators are respectively represented by $Cs1$ and $Cp1$, and electrostatic capacitance values of a series resonator and a parallel resonator in one or more second basic sections including the one or more second resonators and not including the one or more first resonators are respectively represented by $Cs2$ and $Cp2$, at least one of ratios $Cp1/Cs1$ being less than at least one of ratios $Cp2/Cs2$.

2. The multiplexer according to claim 1, wherein a largest value of the ratios $Cp1/Cs1$ is less than a smallest value of the ratios $Cp2/Cs2$.

3. The multiplexer according to claim 1, wherein a geometric mean of the ratios $Cp1/Cs1$ is less than a geometric mean of the ratios $Cp2/Cs2$.

4. The multiplexer according to claim 1, wherein at least a part of each of the one or more first resonators overlaps with at least a part of the one or more first series resonators and/or at least a part of the one or more first parallel resonators in the plan view.

5. The multiplexer according to claim 1, wherein the one or more second resonators include a second series resonator closest to the second terminal in terms of electric connection among the one or more second series resonators and a second parallel resonator closest to the second terminal in terms of electric connection among the one or more second parallel resonators.

6. The multiplexer according to claim 1, wherein all the one or more first resonators are closer to the common terminal in terms of electric connection than any of the one or more second resonators.

7. The multiplexer according to claim 1, wherein the equivalent circuit composed of the basic sections mirror-symmetrically connected is an equivalent circuit calculated by:
combining the one or more second series resonators and the one or more second parallel resonators so that one or more composite series resonators and one or more composite parallel resonators are alternately connected,
dividing the one or more composite series resonators into one or more divided series resonators by dividing in series a composite series resonator, which has a first end to which a first composite parallel resonator with an electrostatic capacitance value of $Cmp1$ is connected, has a second end to which a second composite parallel resonator with an electrostatic capacitance value of $Cmp2$ is connected, and has an electrostatic capacitance value of $Cms$, into a divided series resonator located closer to the first composite parallel resonator and having an electrostatic capacitance value of $Cms \times (Cmp1+Cmp2)/Cmp2$ and another divided series resonator located closer to the second composite parallel resonator and having an electrostatic capacitance value of $Cms \times (Cmp1+Cmp2)/Cmp1$,
dividing the one or more composite parallel resonators into one or more divided parallel resonators by dividing in parallel a composite parallel resonator, which has a first end to which a first divided series resonator with an electrostatic capacitance value of $Cds1$ is connected, has a second end to which a second divided series resonator with an electrostatic capacitance value of $Cds2$ is connected, and has an electrostatic capacitance value of $Cmp$, into a divided parallel resonator located closer to the first divided series resonator and having an electrostatic capacitance value of $Cmp \times Cds1/(Cds1+Cds2)$ and another divided parallel resonator located closer to the second divided series resonator and having an electrostatic capacitance value of $Cmp \times Cds2/(Cds1+Cds2)$, and
determining that the one or more divided series resonators are series resonators of the one or more basic sections and the one or more divided parallel resonators are parallel resonators of the one or more basic sections.

8. The multiplexer according to claim 1, wherein
in each of one or more third resonators among the one or more first series resonators and the one or more first parallel resonators, at least a part of a corresponding third resonator of the one or more third resonators and/or at least a part of a fifth wiring line adjacent to the corresponding third resonator overlap with at least a part of the one or more second series resonators, at least a part of the one or more second parallel resonators, and/or at least a part of the second wiring line in the plan view, the first wiring line including the fifth wring line,
in each of one or more fourth resonators other than the one or more third resonators among the one or more first series resonators, a corresponding fourth resonator of the one or more fourth resonators and a sixth wiring line adjacent to the corresponding fourth resonator overlap with none of the one or more second series resonators, the one or more second parallel resonators, and/the second wiring line in the plan view, the second wiring line including the fifth wiring line,
when the one or more first series resonators and the one or more first parallel resonators are expressed by another equivalent circuit composed of basic sections mirror-symmetrically connected, electrostatic capacitance values of a series resonator and a parallel resonator in one or more third basic sections including the one or more third resonators are respectively represented by Cs3 and Cp3, and electrostatic capacitance values of a series resonator and a parallel resonator in one or more fourth basic sections including the one or more fourth resonators and not including the one or more third resonators are respectively represented by Cs4 and Cp4, at least one of ratios Cp3/Cs3 is less than at least one of ratios Cp4/Cs4.

9. The multiplexer according to claim 8, wherein
at least a part of each of the one or more first resonators overlaps with at least a part of the one or more first series resonators and/or at least a part of the one or more first parallel resonators in the plan view, and
at least a part of each of the one or more third resonators overlaps with at least a part of the one or more second series resonators and/or at least a part of the one or more second parallel resonators in the plan view.

10. The multiplexer according to claim 8, wherein
all the one or more first resonators are closer to the common terminal in terms of electric connection than any of the one or more second resonators, and
all the one or more third resonators are closer to the common terminal in terms of electric connection than any of the one or more fourth resonators.

* * * * *